United States Patent
Forbes et al.

(10) Patent No.: US 7,193,417 B2
(45) Date of Patent: Mar. 20, 2007

(54) BI-PLANAR COIL ASSEMBLIES FOR PRODUCING SPECIFIED MAGNETIC FIELDS

(75) Inventors: Lawrence Kennedy Forbes, Hobart (AU); Stuart Crozier, Wilston (AU)

(73) Assignees: The University of Queensland, Brisbane (AU); The University of Tasmania, Hobart (AU)

( * ) Notice: Subject to any disclaimer, the term of this patent is extended or adjusted under 35 U.S.C. 154(b) by 0 days.

(21) Appl. No.: 10/988,771

(22) Filed: Nov. 15, 2004

(65) Prior Publication Data

US 2005/0104592 A1 May 19, 2005

(30) Foreign Application Priority Data

Nov. 18, 2003 (AU) .............................. 2003906354

(51) Int. Cl.
*G01V 3/00* (2006.01)

(52) U.S. Cl. .................... 324/318; 324/309

(58) Field of Classification Search .............. 324/318, 324/319, 322, 309, 308, 307, 300; 335/301, 335/299, 216; 345/440; 600/410–422
See application file for complete search history.

(56) References Cited

U.S. PATENT DOCUMENTS

| | | | |
|---|---|---|---|
| 3,622,869 A * | 11/1971 | Golay | 324/320 |
| 5,036,282 A * | 7/1991 | Morich et al. | 324/318 |
| 5,289,151 A | 2/1994 | Turner | |
| 5,581,187 A * | 12/1996 | Pausch | 324/318 |
| 5,942,898 A | 8/1999 | Petropoulos et al. | |
| 5,977,771 A * | 11/1999 | Petropoulos | 324/318 |
| 6,140,900 A | 10/2000 | Crozier et al. | |
| 6,144,204 A * | 11/2000 | Sementchenko | 324/318 |
| 6,208,143 B1 | 3/2001 | Conolly et al. | |
| 6,262,576 B1 * | 7/2001 | Petropoulos | 324/318 |
| 6,377,148 B1 * | 4/2002 | Forbes et al. | 335/301 |
| 6,563,315 B1 * | 5/2003 | Boskamp et al. | 324/318 |
| 6,593,742 B1 | 7/2003 | Conolly et al. | |
| 6,664,879 B2 * | 12/2003 | Forbes et al. | 335/301 |
| 6,700,468 B2 * | 3/2004 | Crozier et al. | 335/299 |
| 6,707,455 B2 * | 3/2004 | van Oort et al. | 345/440 |
| 6,788,057 B1 * | 9/2004 | Petropoulos et al. | 324/318 |
| 2002/0105402 A1 | 8/2002 | Crozier et al. | |
| 2004/0194293 A1* | 10/2004 | Begg | 29/606 |

OTHER PUBLICATIONS

Brideson et al., "Determining complicated winding patterns for shim coils using stream functions and the target-field method," *Concepts in Mag. Reson.*, 2002, 14:9-18.

(Continued)

*Primary Examiner*—Brij B. Shrivastav
(74) *Attorney, Agent, or Firm*—Maurice M. Klee

(57) ABSTRACT

Bi-planar coil assemblies are disclosed which have DSV's whose centers are offset by distances D from the origins of x,y,z-coordinate systems, where said origins of x,y,z-coordinate systems are coincident with the geometric centers of the coils. The distances D can be of the order of 10-20 centimeters or more. The bi-planar coil assemblies can be used in MRI applications to reduce the feeling of claustrophobia experienced by some subjects. The assemblies also can facilitate the imaging of various joints, including the wrist, elbow, ankle, or knee.

38 Claims, 27 Drawing Sheets

OTHER PUBLICATIONS

Cover et al., "Undulator design for synchrotron radiation sources using simulated annealing," *IEEE J. Quantum Electronics*, 1995, 31:664-672.

Crozier et al., "Gradient-coil design by simulated annealing," *J. Magn. Reson.*, 1993, A 103:354-357.

Crozier et al., "The design of biplanar, shielded, minimum energy, or minimum power pulsed $B_0$ coils," *MAGMA*, 1995, 3:49-55.

Delves et al., *Computational Methods for Integral Equations*, Cambridge University Press, Cambridge, 1985, p. 307.

Forbes et al., "Asymmetric zonal shim coils for magnetic resonance applications," *Med. Phys.*, 2001, 28:1644-1651.

Forbes et al., "A novel target-field method for finite-length magnetic resonance shim coils: Part 1 Zonal shims," *J. Phys. D: Appl. Phys.*, 2001, 34:3447-3455.

Forbes et al., "A novel target-field method for finite-length magnetic resonance shim coils: Part 2 Tesseral shims," *J. Phys. D: Appl. Phys.*, 2002; 35:839-849.

Forbes et al., "A novel target-field method for magnetic resonance shim coils: Part 3 Shielded gradient and shim coils," *J. Phys. D; Appl. Phys.*, 2003, 36:68-80.

Green et al., "Uniplanar gradient coils for brain imaging," *Proc. Intl. Soc. Mag. Reson. Med.*, 2002, 10:819.

Jin, J., *Electromagnetic Analysis and Design in Magnetic Resonance Engineering*, CRC Press, Boca Raton, 1999.

Martens et al., "Insertable biplanar gradient coils for magnetic resonance imaging," *Rev. Sci. Instrum.* 1991, 62:2639-2645.

Roméo et al., "Magnetic Field Profiling: Analysis and Correcting Coil Design," *Magn. Reson. Med.*, 1984, 1:44-65.

Turner, R., "A target field approach to optimal coil design," *J. Phys. D: Appl. Phys.*, 1986, 19:147-151.

\* cited by examiner

BI-PLANAR COIL ASSEMBLIES FOR PRODUCING SPECIFIED MAGNETIC FIELDS

FIELD OF THE INVENTION

This invention relates to bi-planar coils for producing desired (specified) magnetic fields, and to certain preferred methods for designing such coils.

The coils of this invention are particularly suitable for use in magnetic resonance imaging (MRI) equipment. In that application, bi-planar coils enable high-resolution medical imaging to be performed in a manner that reduces the claustrophobia experienced by many patients, and also allows access by medical specialists. However, the application of the present invention is by no means restricted to MRI technology, and is available in any equipment for which parallel plates might be used to generate a desired magnetic field, e.g., a desired stationary magnetic field. Thus it is envisaged that the present invention may also find application in the design of wiggler magnets in synchrotron technology (see, for example, R. A. Cover, G. Rakowsky, B. L. Bobbs and P. K. Kennedy, 1995, *Undulator design for synchrotron radiation sources using simulated annealing*, IEEE J. Quantum Electronics 31, 664–672).

1. BACKGROUND TO THE INVENTION

Bi-planar coils comprise windings arranged on two parallel planes, and the desired field is produced in some region between them. Shields can also be present, and these comprise further windings arranged on another pair of planes parallel to the primary planes and placed further out from the region of interest. The shields serve the dual purposes of isolating the primary coil from stray external magnetic fields, and of minimizing exterior fields generated by the coil.

In magnetic resonance imaging (MRI) applications that are a primary focus of this invention, a patient is placed in a strong and substantially homogeneous static magnetic field, causing the otherwise randomly oriented magnetic moments of the protons, in water molecules within the body, to precess around the direction of the applied field. The part of the body in the substantially homogeneous region of the overall magnetic field is then irradiated with radio-frequency (RF) energy, causing some of the protons to change their spin orientation. When the RF energy source is removed, the protons in the sample return to their original configuration, inducing measurable signal in a receiver coil tuned to the frequency of precession. This is the magnetic resonance (MR) signal. Most importantly, the frequency at which protons precess depends on the background magnetic field.

In MRI applications, the strong magnetic field is perturbed slightly by the presence of the patient's body. To correct for this effect, gradient and shim coils are used to adjust the magnetic field so as to generate the best possible final image. The field within the specified target volume (specified DSV) is usually represented in terms of spherical harmonics, and the impurities in the field are then represented in terms of the coefficients of an expansion in these harmonics. Gradient and shim coils are therefore designed to correct a perturbed magnetic field by producing a particular spherical harmonic that can be added to the background magnetic field, so as to cancel the effect of a certain harmonic caused by an impurity. There may be many such coils in an MRI device, each correcting for a particular spherical harmonic in the impurity.

Gradient coils also serve the function of linearly encoding precessional frequency with position and hence enabling Fourier image reconstruction to be achieved.

The design task for gradient and shim coils is therefore to determine the winding pattern of the coil such that the desired magnetic field will be produced in a designated region within the coil. In MRI applications, the coil is usually wound on a cylindrical former. This has certain advantages in terms of the quality of the image that is finally produced. A description of these conventional coils in magnetic resonance imaging may be found in the book by Jin (1999, *Electromagnetic Analysis and Design in Magnetic Resonance Engineering*, CRC Press, Boca Raton), for example. Possibly the best-known method for designing gradient and shim windings for cylindrical coils is the "target-field" approach taught by Turner (1986, *A target field approach to optimal coil design*, J. Phys. D: Appl. Phys. 19, 147–151; Electrical coils, U.S. Pat. No. 5,289,151). This technique specifies the desired "target" field inside the cylinder in advance, and then employs Fourier transform methods to calculate the current density on the surface of the coil that is required to generate the target magnetic field. The ill-conditioned nature normally expected from such an inverse problem is overcome by the Fourier transform technique, which essentially assumes that the coil formers are notionally infinite in length. In practice, however, this assumption can usually be circumvented with an appropriate choice of current-density function, which in turn sometimes requires the use of certain smoothing functions in the Fourier space.

A related method for designing coils has been advanced by Forbes, Crozier and Doddrell (Asymmetric zonal shim coils for magnetic resonance, U.S. Pat. No. 6,377,148) and Forbes and Crozier (2001, *Asymmetric zonal shim coils for magnetic resonance applications*, Med. Phys. 28, 1644–1651). This approach is intended to account for the true (finite) length of the coil explicitly, but likewise involves approximations based on the use of Fourier series. Nevertheless, it is capable of designing coils, for target fields located asymmetrically with respect to the coil length, in a very systematic fashion.

Coils of finite length can also be designed directly using the approach of Crozier and Doddrell (1993, *Gradient-coil design by simulated annealing*, J. Magn. Reson. A 103, 354–357). Here, the Biot-Savart law is used to calculate the magnetic field resulting directly from a collection of wires wound on a former. The inverse problem of arranging the wires to produce a desired target magnetic field inside the coil is solved using 'simulated annealing', which is a stochastic optimization strategy. The method is extremely robust and can accommodate many types of constraints easily, simply by adding them to the penalty function. On the other hand, it is possible that complicated magnetic fields (with tesseral components, for example) may be difficult to design by this method, particularly in view of the number of numerical iterations required in the simulated annealing technique.

In a series of three recent papers, a new method has been presented for designing conventional cylindrical coils in such a way that the exact finite-length geometry of the coil is accounted for, without approximation. This technique appears in Forbes and Crozier (*A novel target-field method for finite-length magnetic resonance shim coils: Part 1 Zonal shims*, J. Phys. D: Appl. Phys. 34, 3447–3455, 2001; *Part 2 Tesseral shims*, J. Phys. D: Appl. Phys. 35, 839–849, 2002; *A novel target-field method for magnetic resonance shim coils: Part 3 Shielded gradient and shim coils*, J. Phys.

D: Appl. Phys. 36, 333–333, 2002.); see also Forbes and Crozier (Asymmetric tesseral shim coils for magnetic resonance, U.S. Pat. No. 6,664,879). In this approach, the Biot-Savart law is used for a current sheet distributed over the cylindrical surface of the coil former, and an inverse problem is solved, in which the resulting magnetic field is specified in advance (as a desired target field), and the required current density on the coil is found by solving an integral equation. As expected, the governing equations are so ill-conditioned as to be incapable of yielding a solution in the usual sense; however, this difficulty is overcome using a regularization approach similar to the Tikhonov method (see, for example, Delves and Mohamed, *Computational Methods for Integral Equations*, Cambridge University Press, Cambridge 1985, page 307). This approach works well in practice, and has been used to design a range of different cylindrical shim coils, with asymmetrically located target fields. Once the current-density sheet on the cylinder has been determined by this technique, a streamfunction method is immediately available for designing the complicated winding patterns automatically. Further details can be obtained from the tutorial article by Brideson, Forbes and Crozier (*Determining complicated winding patterns for shim coils using stream functions and the target-field method*, Concepts in Mag. Reson. 14, 9–18, 2002.)

A similar approach has been presented very recently by Green, Bowtell and Morris, and has been adapted to the design of 'uni-planar' coils (2002, *Uniplanar gradient coils for brain imaging*, Proc. Intl. Soc. Mag. Reson. Med. 10, p 819). A uni-planar coil consists simply of windings located on a single plane, and is intended for producing a desired gradient field in a small volume adjacent to the coil. Again, a strong motivation for this work is evidently the desire to create truly open MRI systems, as discussed above.

U.S. Pat. No. 5,977,771 (Single gradient coil configuration for MRI systems with orthogonal directed magnetic fields) and U.S. Pat. No. 6,262,576 (Phased array planar gradient coil set for MRI systems) also disclose a method for designing uni-planar coils, based on the use of Fourier transforms. Mathematically, this technique assumes that the plane of the coil is of infinite extent, but uses a smoothing technique ('apodization') to confine the current to a region of acceptable size.

Bi-planar coils consist of windings placed on parallel planes, and the magnetic field of interest is created in the space between them. They also offer the possibility of more open MRI systems. Some designs have been presented by Martens et al for insertable bi-planar gradient coils (1991, M. A. Martens, L. S. Petropoulos, R. W. Brown, J. H. Andrews, M. A. Morich and J. L. Patrick, *Insertable biplanar gradient coils for magnetic resonance imaging*, Rev. Sci. Instrum. 62, 2639–2645). These authors also assumed plates of infinite extent, so that a solution based on Fourier transforms was again available, and they computed some winding patterns for symmetric gradient coils. This type of approach was extended by Crozier et al to allow for the presence of shields exterior to the primary bi-planar coil (1995, S. Crozier, S. Dodd, K. Luescher, J. Field and D. M. Doddrell, *The design of biplanar, shielded, minimum energy, or minimum power pulsed $B_0$ coils*, MAGMA, 3, 49–55). A similar technique has been used in U.S. Pat. No. 5,942,898 (Thrust balanced bi-planar gradient set for MRI scanners), so as also to incorporate the presence of an external secondary winding set of coils. In that method, the thrust forces on each coil set due to the presence of the other were minimized.

It is an aim of this invention to provide improved methods of designing bi-planar coils and bi-planar coils having improved properties for use in, for example, magnetic resonance imaging.

2. SUMMARY OF THE INVENTION

In accordance with certain of its aspects, this invention provides methods for designing bi-planar coils to produce desired magnetic fields. In accordance with other aspects, the invention provides new forms of bi-planar coils (magnets). The coils may suitably be used as shim, gradient or main magnet coils for use in magnetic resonance imaging (MRI) applications, although they can also be used in other equipment requiring bi-planar coils. The coils are preferably designed using the method aspects of the invention, but can be designed using other methods, if desired.

The method aspects of the invention employ a type of target-field approach, in which the desired field interior to the bi-planar coil is specified in advance. A winding pattern is then designed to produce a field that matches the target as closely as possible. Target fields of any desired type may be specified, and so the method of this invention can be used to design main, gradient, and shim bi-planar coils. Further, target fields that correspond to the superposition of more than one spherical harmonic field can be accommodated. In addition, the target field can be positioned at an arbitrary location within the bi-planar coil. Thus asymmetric bi-planar coils may be designed. In order to control the accuracy of the internal fields, the design methodology is extended to match the target field on two or more interior zones.

When bi-planar shields are also present, the method of this invention imposes an additional constraint of a zero target field on some location(s) external to the coils, and modifies the winding patterns on the primary and the shield so as to match the interior field and the exterior (zero) field as closely as possible.

In one broad form, the invention provides a method of designing a bi-planar coil or set of bi-planar coils to produce a desired field in a target area, comprising the steps of
(a) defining the desired field within the target area,
(b) establishing equations relating the current density for the bi-planar coil to the target field, and
(c) solving the equations using a matrix regularization method.

Typically, discrete current carrying windings are then generated from the calculated current density using a stream function.

The general method is illustrated by the flow chart of FIG. 16. and is demonstrated by the design of various bi-planar main, gradient, and shim coils.

In one embodiment, the invention provides a method for designing a bi-planar coil system, e.g., a shim or gradient coil for a magnetic resonance system, in which the innermost set of bi-planar coils is located on the parallel planes $x=\pm a$. In certain embodiments, these coils are taken to be rectangular in shape, and to occupy the region $-L \leq y \leq L$, $-B \leq z \leq B$. Shielding bi-planar coils may also be included and these are located on the two planes $x=\pm b$, where b is larger than a. Again, in certain embodiments, the shielding coils are assumed to have rectangular geometry, occupying the region $-r_Y L \leq y \leq r_Y L$, $-r_Z B \leq z \leq r_Z B$. Here, the two constants $r_Y$ and $r_Z$ are dimensionless scaling ratios (relative to the size of the primary coils). The methods of these embodiments comprise the steps of:

(a) selecting the planes at x=±a, and optionally x=±b, for calculating current densities for the coil, where the planes extend along the y and z directions and the regions in which windings are located are generally rectangular in shape;

(b) selecting a set of desired values for the component of the magnetic field Bx (or Hx) to be produced by the coil at locations on the planes x=±$c_1$, x=±$c_2$ with 0<$c_2$<$c_1$<a. (Note that more than two target planes can be selected, if desired). Each of these target zones is specified on the rectangular region −$α_T$L≦y≦$α_T$L, pB<z<qB, in which the dimensionless numbers p and q satisfy the constraints −1<p<q<1 and $α_T$ is a scaling constant. (For example, the desired values for the magnetic field component could be defined by a preselected spherical harmonic, a combination of harmonics or a uniform field). The symmetry of the target field in the x-direction (either even or odd) determines whether or not the windings in the two planes of the bi-planar coil set are wound in the same direction or are counterwound (see, for example, equations 4.6a and 4.6b below). In the case of a shielded coil, an additional target field can be specified at x=±$c_3$ with $c_3$>b. Each of these additional target zones is specified on the rectangular region −βL≦y≦βL, −γB≦z≦γB where β and γ are dimensionless scaling ratios; and (c) determining a current density distribution j(y,z) for the coil(s) by:
    (1) establishing equations for the relationships between the current density and the target fields (see, for example, equations 4.1–4.9 herein); and
    (2) solving said equations using a matrix regularization method (see, for example, equations 4.10–4.18), wherein the regularized expression to be minimized, in one preferred embodiment, is the curvature of the streamfunction defined by, for example, equations 4.14 and 4.15.

In other embodiments, the quantities for minimization in the regularization procedure can be the energy and/or the power and/or the torque contained in or produced by the device.

The procedures outlined in steps (1) and (2) above can be preferably used for multiple target regions including an external field normally set to zero for the purposes of actively shielding the coil set (i.e., reducing the stray field outside the coils).

The method preferably includes the additional step of generating discrete current carrying windings for the bi-planar coil from the current density j(y,z) by:

(1) creating a streamfunction ψ from the current density j(y,z) according to, for example, equations 4.7a and 4.7b herein;

(2) selecting a number of current carrying windings N;

(3) determining a current per winding value I=J/N, where J is the total current obtained by integrating the current density vector over the surface x=a (for example);

(4) contouring the streamfunction ψ and thereby determining a set of j(y,z) blocks on, for example, said x=a surface over the surface dimensions such that the integral of j(y,z) over each block equals I; and (5) for all blocks having a net polarity for j(y,z) over the block, placing a winding at the center of the block, with the direction of the current in the winding (or the winding direction) corresponding to said net polarity.

This method can be used for symmetrical (i.e. |p|=|q|) and asymmetrical (|p|≠|q|) cases.

In accordance with further aspects (the "apparatus aspects"), the invention provides bi-planar coil assemblies for producing magnetic fields where the magnetic field comprises one or more specified spherical harmonics (e.g., the $T_{00}$ spherical harmonic in the case of a bi-planar coil assembly that produces a main magnetic field, the $T_{11}$ spherical harmonic in the case of a gradient coil, and/or the $T_{21}$ spherical harmonic in the case of a shim coil) in a specified volume (e.g., the DSV in the case of a magnetic resonance imaging system). (As known in the art, the term "DSV" is used to represent the imaging region of a magnetic resonance system. Originally, the DSV had the meaning "diameter of spherical volume." Subsequently, it came to mean the "diameter of the sensitive volume." However, today, imaging regions are not necessarily spherical and thus as used herein, the DSV is the imaging region irrespective of whether that region is spherical or has some other shape.)

In accordance with first embodiments of the apparatus aspects of the invention, the bi-planar coil assembly comprises:

(I) a first coil assembly (e.g., 3 in FIG. 17A), said assembly comprising one or more windings (e.g., 5 in FIG. 17A) that (i) define a first plane (e.g., x=a in FIG. 1) and (ii) have an outer perimeter in said first plane, said outer perimeter defining a first rectangle (e.g., 7 in FIG. 17A) having four sides each of which is tangent to the outer perimeter, said first rectangle having (a) the smallest area A of any rectangle which encloses the one or more windings and (b) two diagonals (e.g., 9,11 in FIG. 17A) which intersect at a centroid (the centroid of the first rectangle) (e.g., 13 in FIG. 17A); and (II) a second coil assembly (e.g., 3' in FIG. 17A), said assembly comprising one or more windings (e.g., 5' in FIG. 17A) that (i) define a second plane (e.g., x=−a in FIG. 1) and (ii) have an outer perimeter in said second plane, said outer perimeter defining a second rectangle (e.g., 7' in FIG. 17A) having four sides each of which is tangent to the outer perimeter, said second rectangle having (a) the smallest area of any rectangle which encloses the one or more windings and (b) two diagonals (e.g., 9',11' in FIG. 17A) which intersect at a centroid (the centroid of the second rectangle) (e.g., 13' in FIG. 17A);

wherein:

(1) the first and second planes are parallel and spaced from one another;

(2) a line through the centroids of the first and second rectangles defines an x-axis of an x,y,z-coordinate system (e.g., the x-axis of FIG. 1), the origin (e.g., 17 in FIG. 1) of which lies at a point on said x-axis that is equidistant from the first and second planes;

(3) the bi-planar coil assembly produces a magnetic field, the x-component of which, in general form, can be written as:

$$B(r, \theta, \phi) = \sum_{n=0}^{\infty} \sum_{m=0}^{m=n} r^n [A_{nm}\cos(m\phi) + B_{nm}\sin(m\phi)] P_{nm}(\cos\theta)$$

where $A_{nm}$ and $B_{nm}$ are the amplitudes of spherical harmonics, $P_{nm}(\cos\theta)$ are associated Legendre polynomials, n is the order and m the degree of the polynomial, and r,θ, and φ are polar co-ordinates of a polar coordinate system that has an origin that (a) lies in the y-z plane of the x,y,z-coordinate system and (b) is offset from the origin (e.g., 17 in FIG. 1) of the x,y,z-coordinate system;

(4) the specified volume lies between the first and second planes and has a center that lies at the origin of the polar coordinate system; and (5) at least one of the one or more specified spherical harmonics has a degree m' and an order n' which satisfy the relationships:
  (i) m'≧0, and
  (ii) n'=0 or n'≧2.

In accordance with these embodiments, the specified volume when projected onto the first plane preferably has a projected area A' that is greater than or equal to 0.05·A and more preferably greater than or equal to 0.1·A. For example, for a specified volume that is a sphere, the projected area A' will be a circle having a radius equal to the radius of the sphere, while for a prolate spheroid having its long axis along the z-axis in FIG. 1, the projected area A' will be an ellipse with long and short axes corresponding to the long and short axes of the prolate spheroid. Projected areas for specified volumes having other configurations will be readily determined by persons of ordinary skill in the art from the present disclosure.

In accordance with second embodiments of the apparatus aspects of the invention, the bi-planar coil assembly comprises:

(I) a first coil assembly (e.g., 3 in FIG. 17B), said assembly comprising one or more windings (e.g., 5 in FIG. 17B) that (i) define a first plane (e.g., x=a in FIG. 1) and (ii) have an outer perimeter in said first plane, said outer perimeter defining a first rectangle (e.g., 7 in FIG. 17B) having four sides each of which is tangent to the outer perimeter, said first rectangle having (a) the smallest area A of any rectangle which encloses the one or more windings and (b) two diagonals (e.g., 9,11 in FIG. 17B) which intersect at a centroid (the centroid of the first rectangle) (e.g., 13 in FIG. 17B); and (II) a second coil assembly (e.g., 3' in FIG. 17B), said assembly comprising one or more windings (e.g., 5' in FIG. 17B) that (i) define a second plane (e.g., x=-a in FIG. 1) and (ii) have an outer perimeter in said second plane, said outer perimeter defining a second rectangle (e.g., 7' in FIG. 17B) having four sides each of which is tangent to the outer perimeter, said second rectangle having (a) the smallest area of any rectangle which encloses the one or more windings and (b) two diagonals (e.g., 9',11' in FIG. 17B) which intersect at a centroid (the centroid of the second rectangle) (e.g., 13' in FIG. 17B);

wherein:

(1) the first and second planes are parallel and spaced from one another;

(2) a line through the centroids of the first and second rectangles defines an x-axis of an x,y,z-coordinate system (e.g., the x-axis of FIG. 1), the origin (e.g., 17 in FIGS. 1 and 10) of which lies at a point on said x-axis that is equidistant from the first and second planes;

(3) the bi-planar coil assembly produces a magnetic field, the x-component of which, in general form, can be written as:

$$B(r, \theta, \phi) = \sum_{n=0}^{\infty} \sum_{m=0}^{m=n} r^n [A_{nm}\cos(m\phi) + B_{nm}\sin(m\phi)] P_{nm}(\cos\theta)$$

where $A_{nm}$ and $B_{nm}$ are the amplitudes of spherical harmonics, $P_{nm}(\cos\theta)$ are associated Legendre polynomials, n is the order and m the degree of the polynomial, and r, θ, and φ are polar co-ordinates of a polar coordinate system that has an origin (e.g., 15 in FIG. 10) that (a) lies in the y-z plane of the x,y,z-coordinate system and (b) is offset (e.g., by the distance D in FIG. 10) from the origin (e.g., 17 in FIG. 10) of the x,y,z-coordinate system;

(4) the specified volume (e.g., 19 in FIG. 10) lies between the first and second planes and has a center (e.g., 21 in FIG. 10) that lies at the origin (e.g., 15 in FIG. 10) of the polar coordinate system;

(5) at least one of the one or more specified spherical harmonics has a degree m' and an order n' which satisfy the relationships n'=1 and m'=0 or m'=1 (the one or more specified gradient harmonics);

(6) the specified volume (e.g., 19 in FIG. 10) comprises a portion (the substantially linear portion of the specified volume) throughout which each of the one or more specified gradient harmonics has a calculated deviation from linearity that is less than or equal to 10 percent (preferably less than or equal to 5 percent); and (7) the substantially linear portion of the specified volume when projected onto the first plane (e.g., x=a in FIG. 1) has a projected area $A_L$ that is greater than or equal to 0.05·A (preferably greater than or equal to 0.1·A).

The projected area $A_L$ for the second embodiments of the apparatus aspects of the invention is determined in the same manner as the projected area A' referred to above in connection with the first embodiments. Indeed, preferably, the substantially linear portion of the specified volume is the entire specified volume, so that in the preferred second embodiments, $A_L$ and A' are the same.

As used herein a gradient harmonic has a calculated deviation from linearity that is less than or equal to "x" percent in a volume if:

100·(max|gradient|−mean|gradient|)/mean|gradient|≦x where max|gradient| is the maximum value of the magnitude of the calculated gradient in the volume and mean|gradient| is the mean value of the magnitudes of the calculated gradient in the volume.

In connection with both the first and second embodiments of the apparatus aspects of the invention, the origin of the polar coordinate system lies at a distance D from the origin of the x,y,z-coordinate system, where D is preferably at least 5%, more preferably at least 10%, and most preferably at least 20% of the length D' of a diagonal of the first rectangle. In terms of physical dimensions, D is preferably greater than or equal to 10 centimeters and more preferably greater than or equal to 20 centimeters.

Also in connection with both the first and second embodiments of the apparatus aspects of the invention, the bi-planar coil assembly of the invention preferably further comprises:

(i) a third coil assembly, said assembly comprising one or more windings that define a third plane (e.g., the x=b plane in FIG. 1); and (ii) a fourth coil assembly, said assembly comprising one or more windings that define a fourth plane (e.g., the x=b plane in FIG. 1);

wherein:
(1) the third plane is parallel to and spaced outward from the first plane along the x-axis;
(2) the fourth plane is parallel to and spaced outward from the second plane along the x-axis; and
(3) the third and fourth coils are shielding coils that serve to reduce the magnitude of the magnetic field produced by the bi-planar coil assembly outside of the third and fourth coil assemblies (e.g., the magnitude of the magnetic field outside of the planes $x=\pm c_3$ in FIG. 1).

In accordance with conventional practice in the art, a "coil assembly", e.g., the first, second, third, or fourth coil assembly, as well as the overall bi-planar coil assembly, includes the actual windings making up the coil, the structures which carry those windings and/or serve to mount the windings in an overall magnet system, and the power supplies, amplifiers, cooling equipment, and control electronics typically provided with the windings. The examples presented below employ coil assemblies in which the two windings making up a bi-planar coil have identical sizes and shapes. If desired, the windings can have somewhat different sizes and/or shapes in which case the first and second rectangles referred to above will, in general, not be identical. In such a case, the first rectangle is the rectangle that has the smaller area.

The examples illustrate windings having perimeters that are substantially circular and substantially rectangular (specifically, substantially square). Although for many applications these are the preferred shapes, it is to be understood that the invention is not limited to these shapes and others can be used in the practice of the invention.

The bi-planar coils of the first and/or second embodiments of the apparatus aspects of the invention can be used as main coils, gradient coils, and/or shim coils of a magnetic resonance system. Preferably, entire gradient and/or shim sets are composed of the bi-planar coils of the invention.

The bi-planar coil assemblies of the invention preferably exhibit substantial purities for the one or more specified spherical harmonics. In particular, when the one or more specified spherical harmonics is a single harmonic, the bi-planar coil assembly preferably has a calculated purity P' that is less than or equal to 0.2 (more preferably less than or equal to 0.05), where P' equals the ratio of (1) the sum of the magnitudes of all harmonic coefficients other than the coefficient of the single harmonic which have a magnitude which is at least 0.001% of the magnitude of the coefficient of the single harmonic to (2) the magnitude of the coefficient of the single harmonic, where the coefficients of the spherical harmonics are calculated based on calculated or measured field strengths at points within and/or on the outer periphery of the specified volume. When the one or more specified spherical harmonics comprises at least two harmonics, the bi-planar coil assembly preferably has a calculated purity P' that is less than or equal to 0.2 (more preferably less than or equal to 0.05), where P' equals the ratio of (1) the sum of the magnitudes of all harmonic coefficients other than the coefficients of the at least two harmonics which have a magnitude which is at least 0.001% of the magnitude of the largest coefficient of the at least two harmonics to (2) the sum of the magnitudes of the coefficients of the at least two harmonics, where the coefficients of the spherical harmonics are calculated based on calculated or measured field strengths at points within and/or on the outer periphery of the specified volume.

In accordance with a further aspect, the invention provides a magnetic resonance system comprising:
(a) a bi-planar coil assembly (e.g., 25 in FIG. 18) for producing a main magnetic field, said assembly having a main magnet DSV (e.g., 19 in FIG. 18) and a main magnet geometric center (e.g., reference point 31 projected to the midplane of the bi-planar coils in FIG. 18);
(b) three bi-planar coil assemblies (e.g., 27 in FIG. 18) for producing x, y, and z gradient fields, each assembly having a gradient DSV; and
(c) a set of bi-planar coil assemblies (e.g., 29 in FIG. 18) for producing shim fields, each member of the set having a shim DSV;
wherein the main magnet, gradient, and shim DSV's have a common center which is offset (e.g., by distance D in FIG. 18) from the main magnet geometric center (e.g., the common center is preferably offset from the main magnet geometric center by 10 centimeters and more preferably by 20 centimeters).

In accordance with an additional aspect, the invention provides a method of forming a magnetic resonance image of a portion of a subject's body (e.g., the subject's wrist, elbow, ankle, or knee) comprising:
(A) providing a magnetic resonance system which comprises:
(i) a bi-planar coil assembly (e.g., 25 in FIG. 18) for producing a main magnetic field, said assembly having a main magnet DSV (e.g., 19 in FIG. 18) and a main magnet geometric center (e.g., reference point 31 projected to the midplane of the bi-planar coils in FIG. 18),
(ii) three bi-planar coil assemblies (e.g., 27 in FIG. 18) for producing x, y, and z gradient fields, each assembly having a gradient DSV, and
(iii) a set of bi-planar coil assemblies (e.g., 29 in FIG. 18) for producing shim fields, each member of the set having a shim DSV, said main magnet, gradient, and shim DSV's have a common center which is offset (e.g., by distance D in FIG. 18) from the main magnet geometric center (e.g., the common center is preferably offset from the main magnet geometric center by 10 centimeters and more preferably by 20 centimeters);
(B) placing the portion of the subject's body in the main magnet DSV (e.g., 19 in FIG. 18); and
(C) using the magnetic resonance system to form a magnetic resonance image of the portion of the subject's body.

In accordance with a still further aspect, the invention provides a method of forming a magnetic resonance image of a portion of a subject's body (e.g., the subject's wrist, elbow, ankle, or knee) comprising:
(A) providing a magnetic resonance system which comprises a bi-planar coil assembly (e.g., 25 in FIG. 18) for producing a main magnetic field, said assembly having a main magnet geometric center (e.g., reference point 31 projected to the midplane of the bi-planar coils in FIG. 18) and a main magnet DSV (e.g., 19 in FIG. 18), said main magnet DSV having a center that is offset (e.g., by distance D in FIG. 18) from the main magnet geometric center (e.g., the DSV's center is preferably offset from the main magnet geometric center by 10 centimeters and more preferably by 20 centimeters);
(B) placing the portion of the subject's body in the main magnet DSV (e.g., 19 in FIG. 18); and
(C) using the magnetic resonance system to form a magnetic resonance image of the portion of the subject's body.

With regard to the these last two aspects of the invention, it should be noted that imaging of joints is often difficult for a subject when a magnetic resonance system having a symmetrically-located DSV is used since it is difficult to place the joint in the DSV. With an offset DSV, on the other hand, such imaging can be made much more convenient for the subject. For example, in the case of wrist imaging, the subject can, in many cases, place his or her wrist in the DSV while sitting in a chair.

The reference symbols used in the above summaries of the various aspects of the invention are only for the convenience of the reader and are not intended to and should not be interpreted as limiting the scope of the invention. More generally, it is to be understood that both the foregoing general description and the following detailed description are merely exemplary of the invention, and are intended to provide an overview or framework for understanding the nature and character of the invention.

Additional features and advantages of the invention are set forth in the detailed description which follows, and in part will be readily apparent to those skilled in the art from that description or recognized by practicing the invention as described herein. The accompanying drawings are included to provide a further understanding of the invention, and are incorporated in and constitute a part of this specification.

In particular, in order that the invention may be more fully understood and put into practice, one or more embodiments thereof will now be described, by way of example only, with reference to the accompanying drawings.

3. BRIEF DESCRIPTION OF THE DRAWINGS

FIG. 1 is a diagram illustrating a bi-planar coil system which includes a primary bi-planar coil and a shielding bi-planar coil. The primary coil is located on the pair of planes $x=\pm a$, and the shield coil consists of windings on the parallel planes $x=\pm b$. The desired target field is specified on the two sets of interior planes $x=\pm c_1$ and $x=\pm c_2$ and there is an exterior zero target field imposed on the plane $x=\pm c_3$. The coordinate system is indicated, in which the z-axis lies along the centre of the coil.

FIG. 2 shows a winding pattern for a $T_{00}$ (constant field) unshielded symmetric bi-planar coil. The winding pattern for one coil is shown, the pattern for the other coil being the same. The winding pattern was obtained by contouring the computed streamfunction. The parameters used in this calculation are L=B=1 meter, a=0.5 meter, and $H_{max}=1$ Amp/meter. The target zones are defined by the parameters $\alpha_T=0.5$, p=−0.5, q=0.5, $c_1=0.35$ meter, $c_2=0.2$ meter.

FIG. 3 shows winding patterns for a $T_{00}$ (constant field) symmetric bi-planar coil, for (a) the primary coil (FIG. 3A), and (b) the shield (FIG. 3B). One winding pattern is shown for each coil, the other winding pattern being the same. The parameters used in this calculation are L=B=1 meter, a=0.5, b=0.75 meter and $H_{max}=1$ Amp/meter. The target zones are defined by the parameters $\alpha_T=0.5$, p=−0.5, q=0.5, c=0.35, $c_2=0.2$ meter, and $\beta=\gamma=1$, $r_Y=r_Z=$, $c_3=0.9$ meter.

Figure 6A:
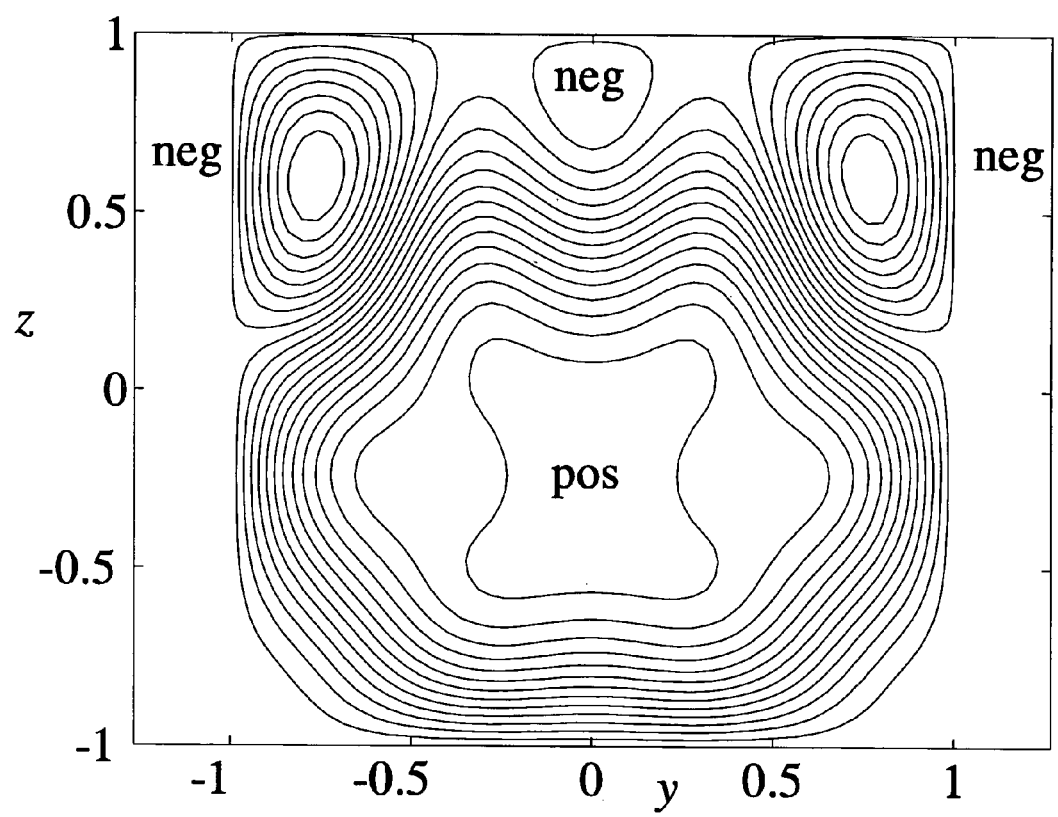
Figure 6B:
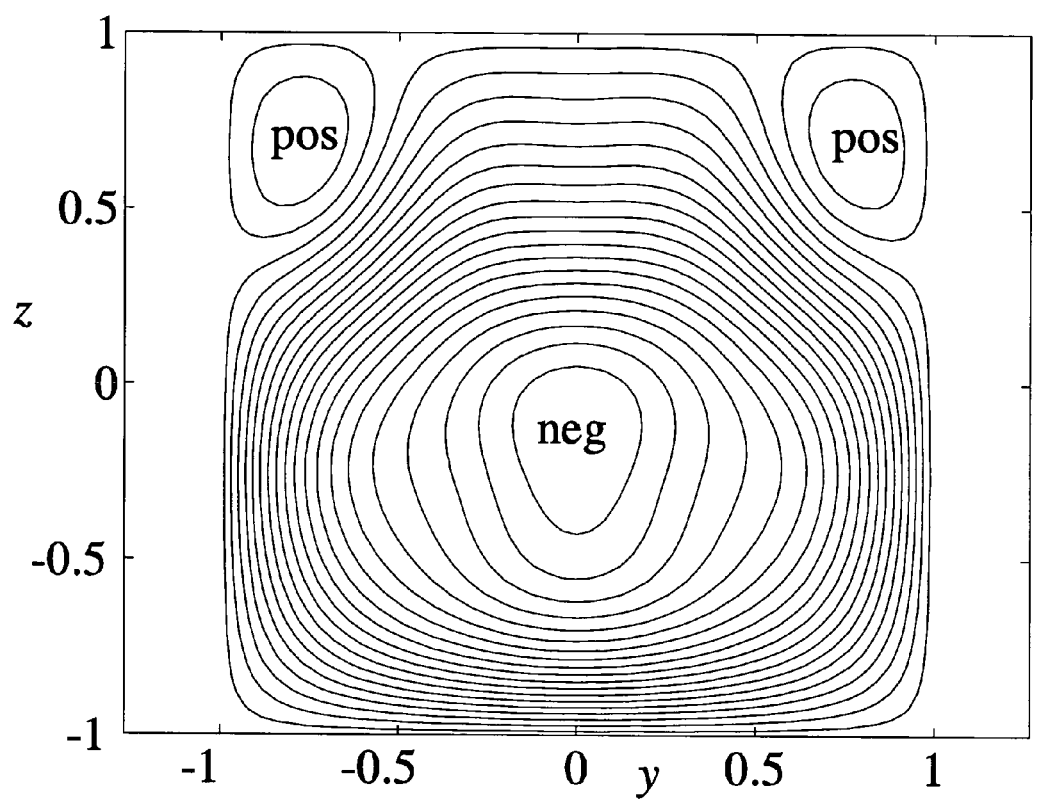

FIG. 6 shows winding patterns for a $T_{00}$ asymmetric constant field bi-planar coil, for (a) the primary coil (FIG. 6A), and (b) the shield (FIG. 6B). One winding pattern is shown for each coil, the other winding pattern being the same. The parameters used in this calculation are L=B=1 meter, a=0.5, b=0.75 meter and $H_{max}=1$ Amp/meter. The target zones are defined by the parameters $\alpha_T=0.5$, p=−0.7, q=0.1, $c_1=0.35$, $c_2=0.2$ meter, and $\beta y=1$, $r_Y=r_Z=1$, $c_30.9$ meter.

Figure 7A:
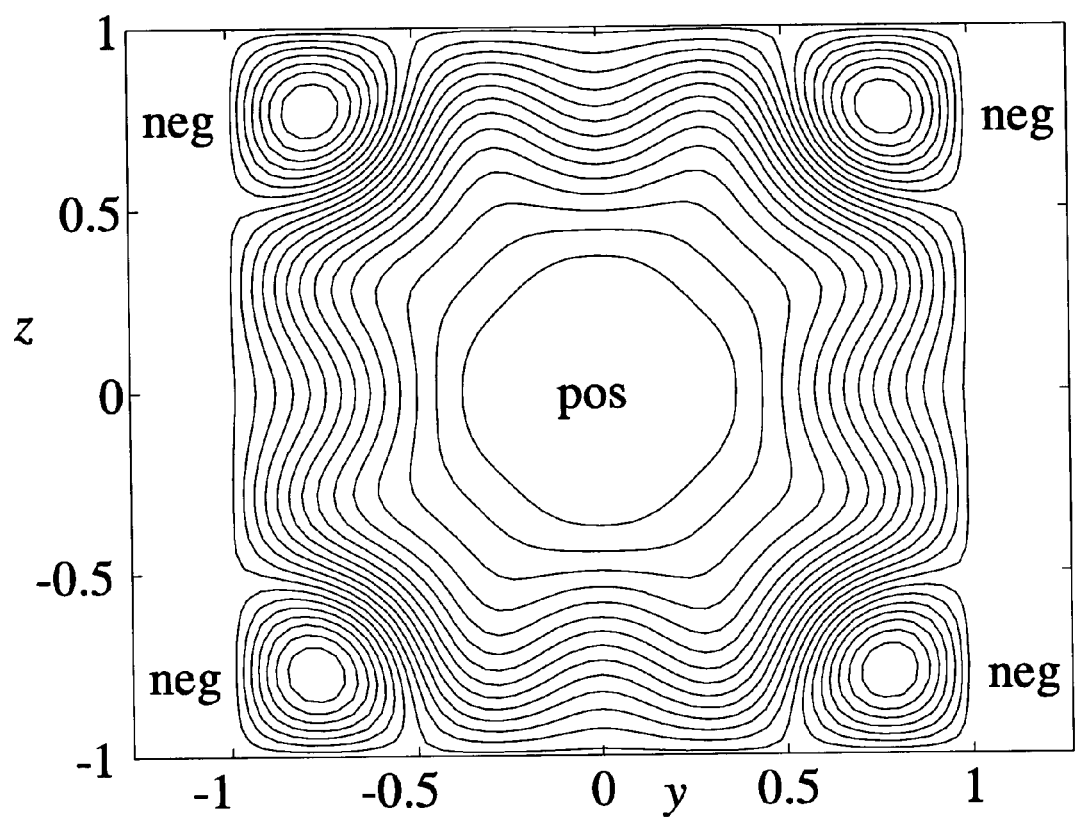
Figure 7B:
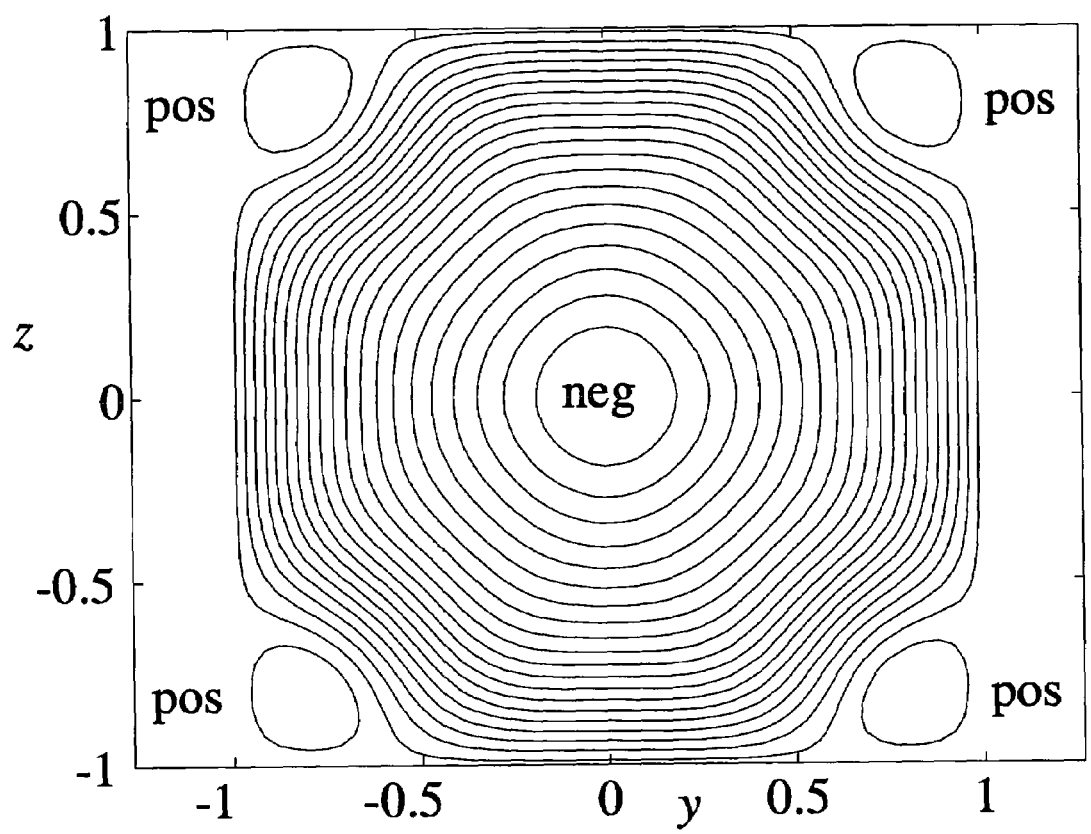

FIG. 7 shows winding patterns for a $T_{11}$ (x-gradient field) symmetric bi-planar coil, for (a) the primary coil (FIG. 7A), and (b) the shield (FIG. 7B). One winding pattern is shown for each coil, the other winding pattern being the same. The parameters used in this calculation are L=B=1 meter, a=0.5, b=0.75 meter and $H_{max}=1$ Amp/meter. The target zones are defined by the parameters $\alpha_T=0.5$, p=−0.5, q=0.5, $c_1=0.35$, $c_2=0.2$ meter, and $\beta=\gamma=1$, $r_Y=r_Z=1$, $c_3=0.9$ meter.

Figure 8:
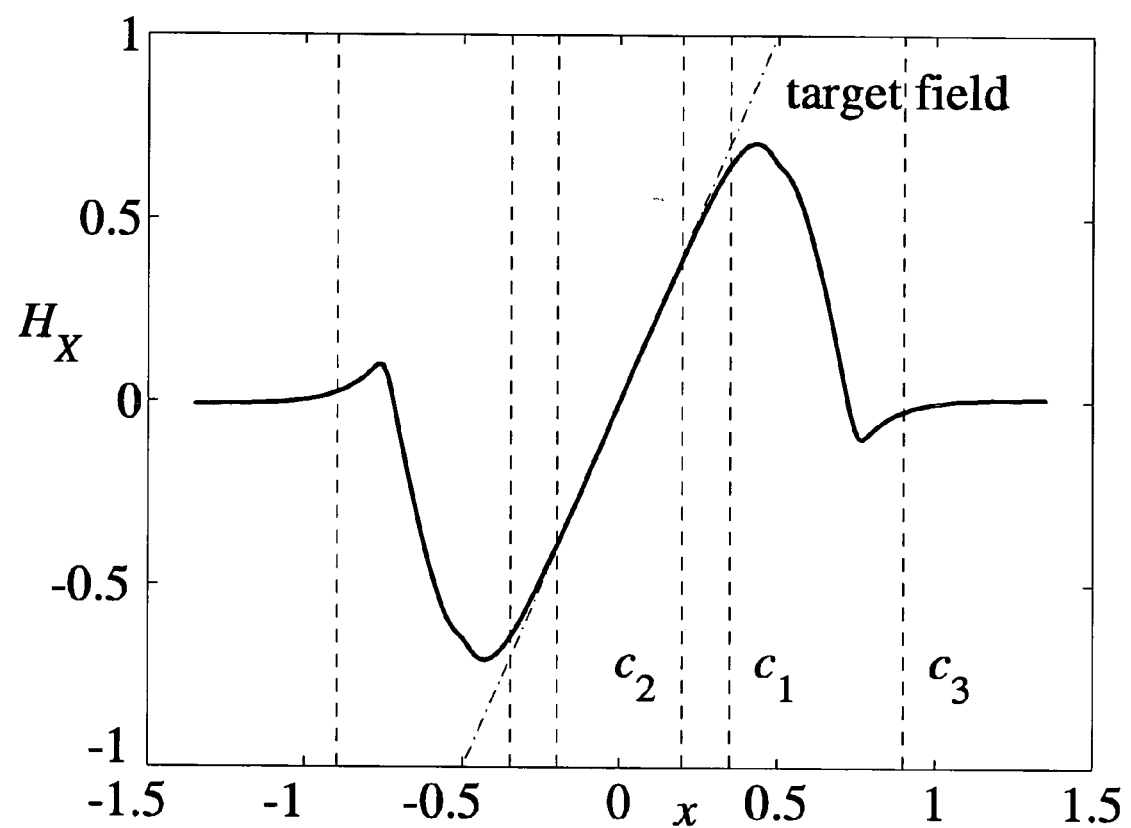

FIG. 8 shows the $H_X$ field on a portion of the centre-line (x-axis), obtained with the shielded coil of FIG. 7. The target field is indicated by the dot-dash line on the figure. The vertical dashed lines indicate the locations of the three pairs of target zones.

Figure 9A:
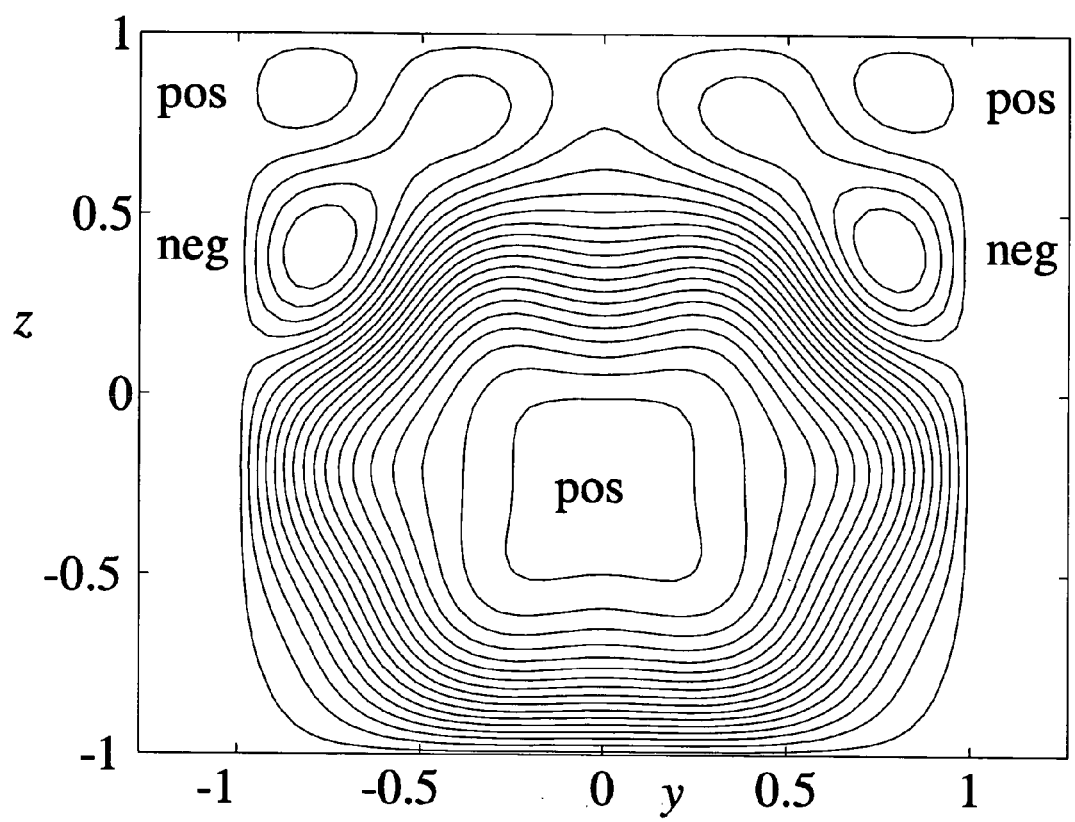
Figure 9B:
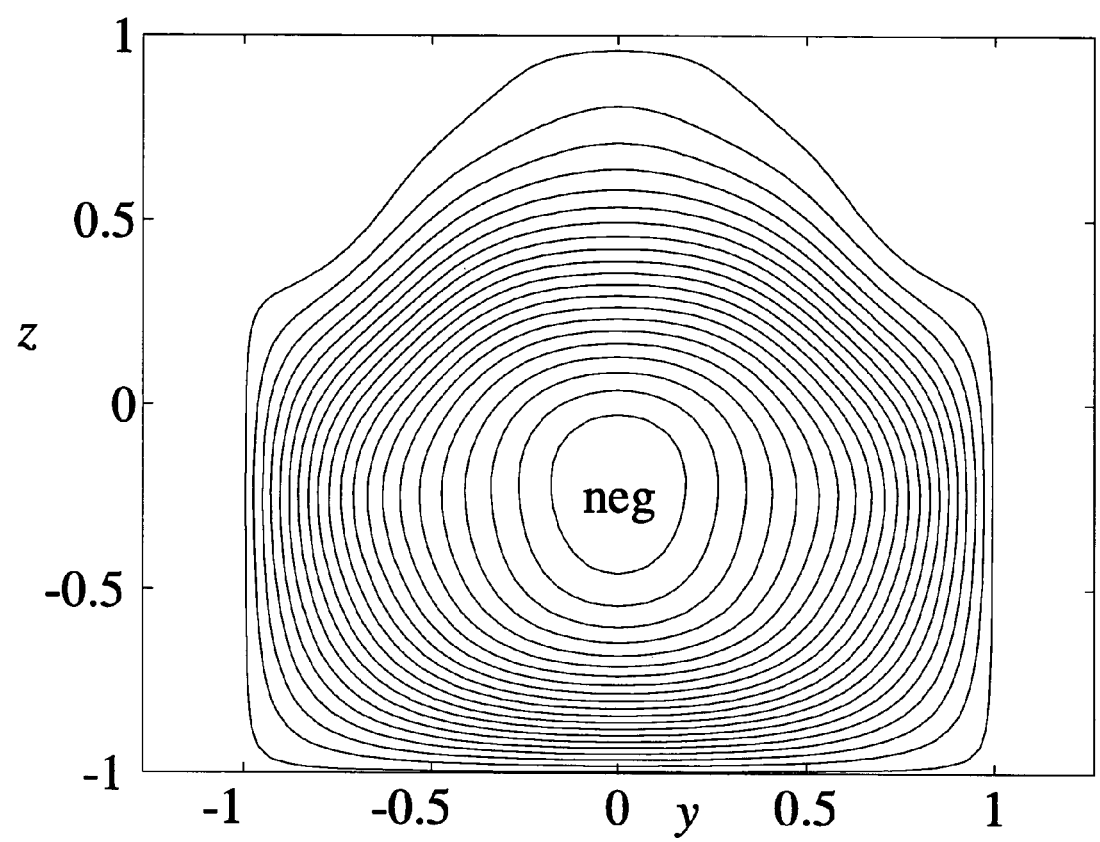

FIG. 9 shows winding patterns for a $T_{11}$ asymmetric gradient bi-planar coil, for (a) the primary coil (FIG. 9A), and (b) the shield (FIG. 9B). One winding pattern is shown for each coil, the other winding pattern being the same. The parameters used in this calculation are L=B=1 meter, a=0.5, b=0.75 meter and $H_{max}=1$ Amp/meter. The target zones are defined by the parameters $\alpha_T=0.5$, p=−0.7, q=0.1, $c_1=0.35$, $c_2=0.2$ meter, and $\beta=\gamma=1$, $r_Y=r_Z=1$, $c_3=0.9$ meter.

Figure 10:
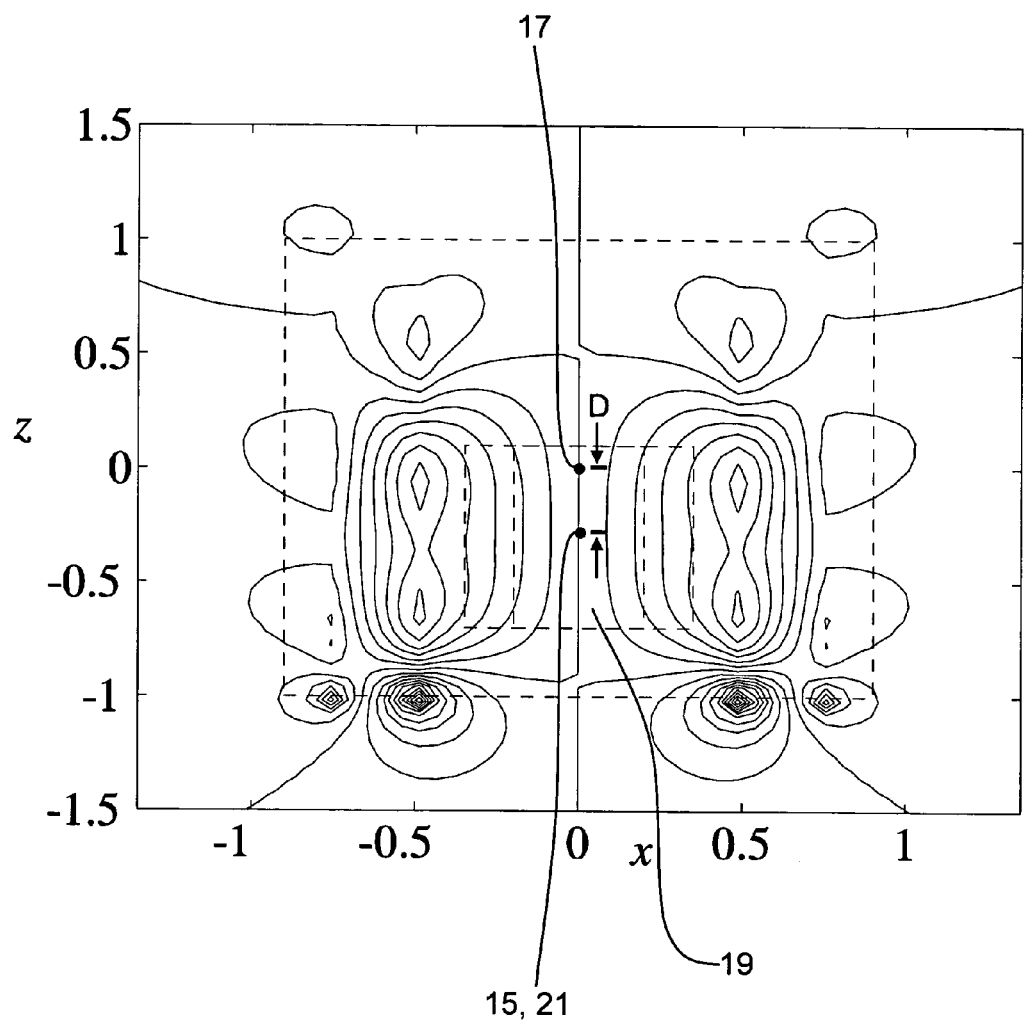

FIG. 10 shows contours for the $H_X$ component of the magnetic field produced by the shielded $T_{11}$ asymmetric coil of FIG. 9, on the centre-plane y=0. The dashed lines indicate the three target regions.

Figure 11A:
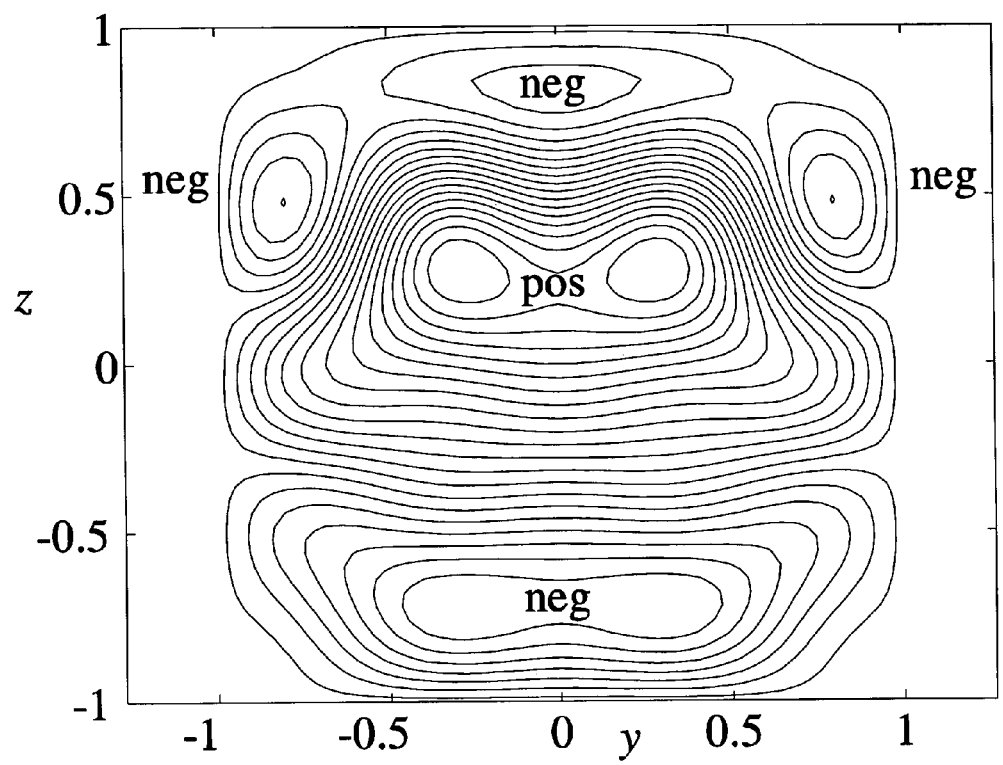
Figure 11B:
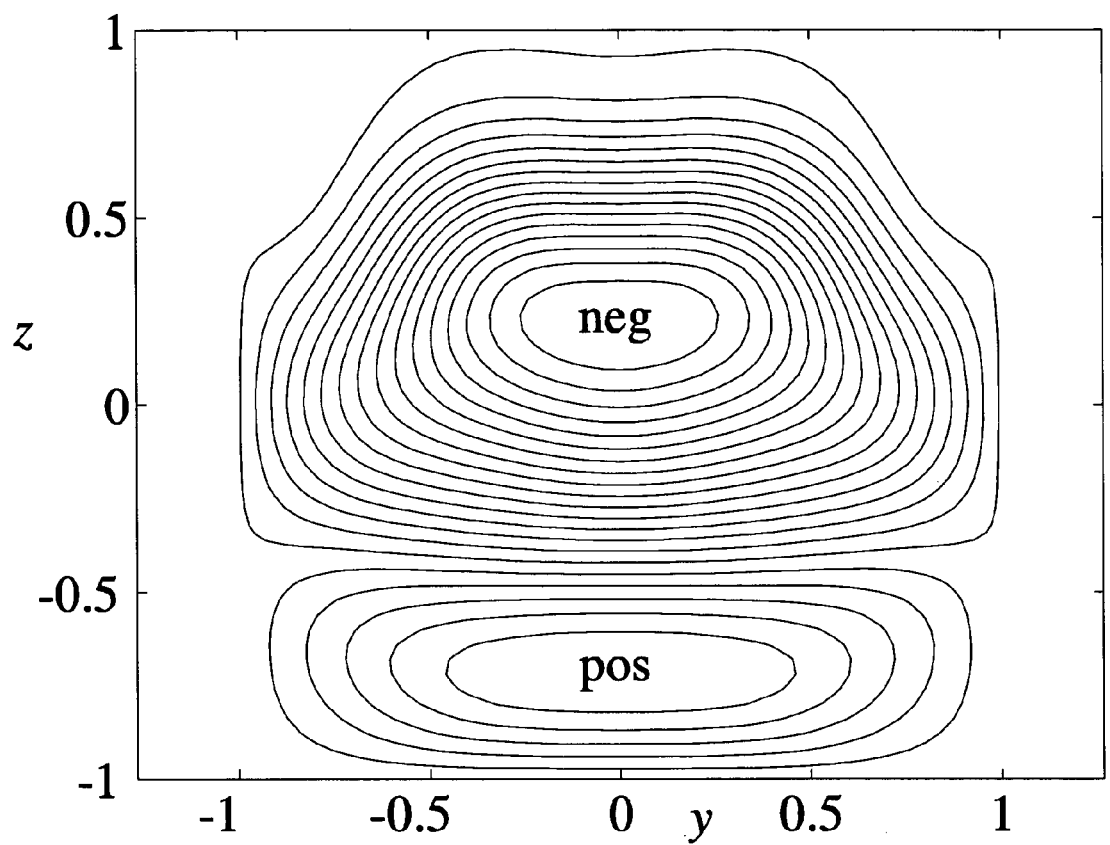

FIG. 11 shows winding patterns for a $T_{21}$ asymmetric shim bi-planar coil, for (a) the primary coil (FIG. 11A), and (b) the shield (FIG. 11B). One winding pattern is shown for each coil, the other winding pattern being the same. The parameters used in this calculation are L=B=1 meter, a=0.5, b=0.75 meter and $H_{max}=1$ Amp/meter. The target zones are defined by the parameters $\alpha_T=0.5$, p=−0.7, q=0.1, $c_1=0.35$, $C_2=0.2$ meter, and $\beta=\gamma y=1$, $r_Y=r_Z=1$, $c_3=0.9$ meter.

Figure 12A:
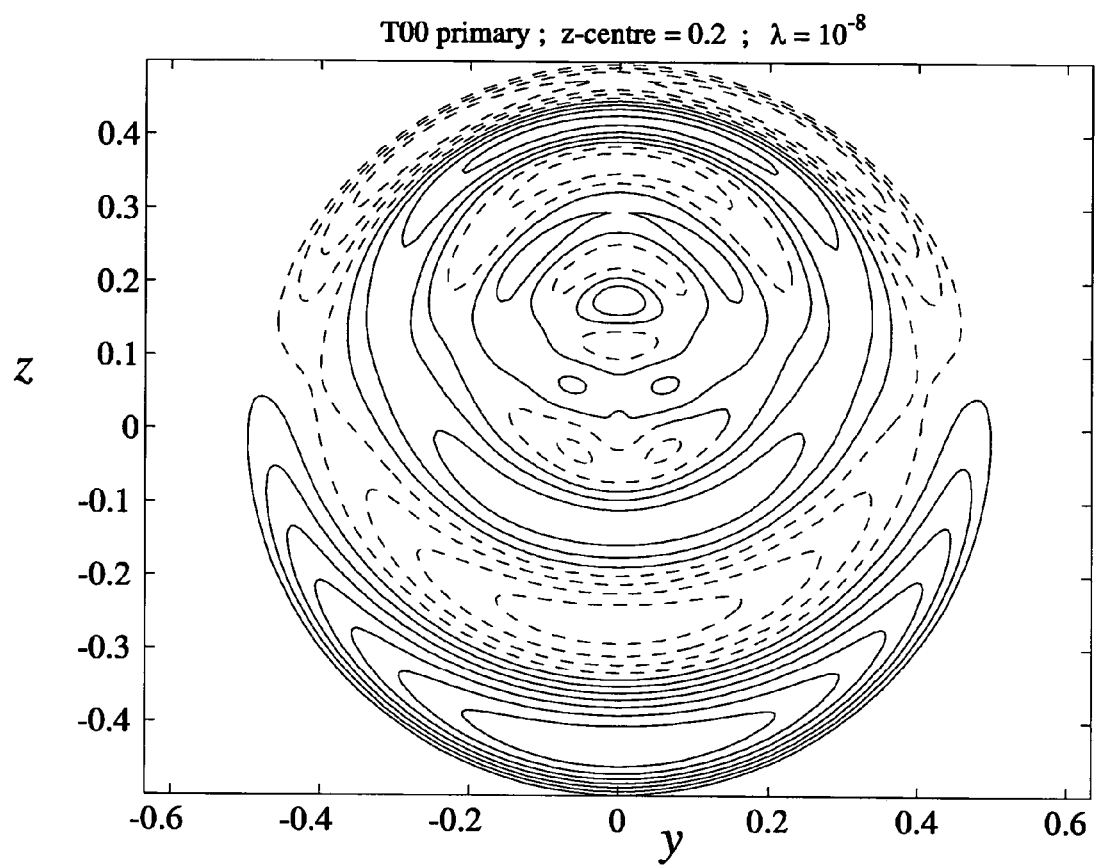
Figure 12B:
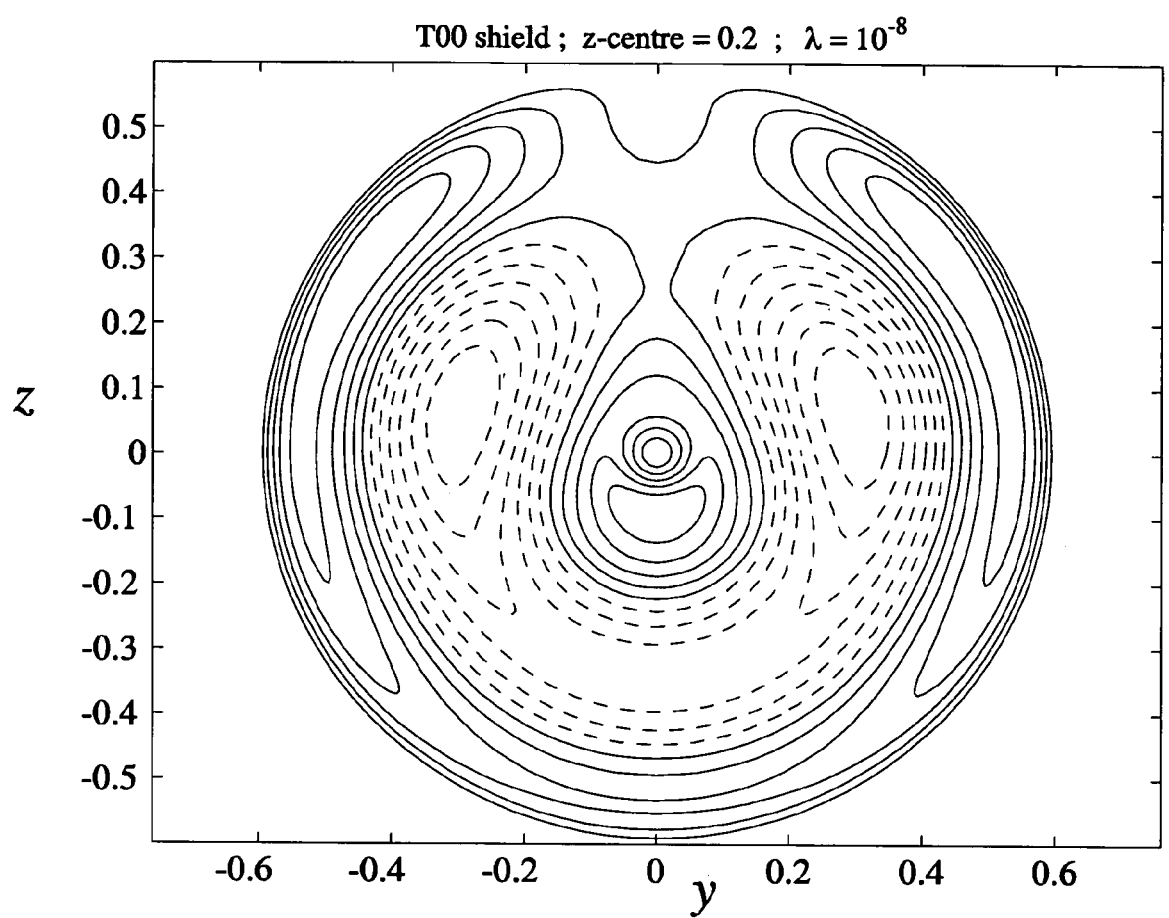

FIG. 12 shows winding patterns for a $T_{00}$ asymmetric circular bi-planar coil, for (a) the primary coil (FIG. 12A), and (b) the shield (FIG. 12B). One winding pattern is shown for each coil, the other winding pattern being the same. The parameters used in this calculation are a=0.4, b=0.6, R=0.5 and S=0.6 meter and $H_{max}=1$ Amp/meter. The target zones are defined by the parameters $c_1=0.25$ $c_2=0.1$, $z_c=0.2$ meter, and $c_3=1.5$ meter. Dashed lines indicate windings carrying reverse current.

Figure 13:
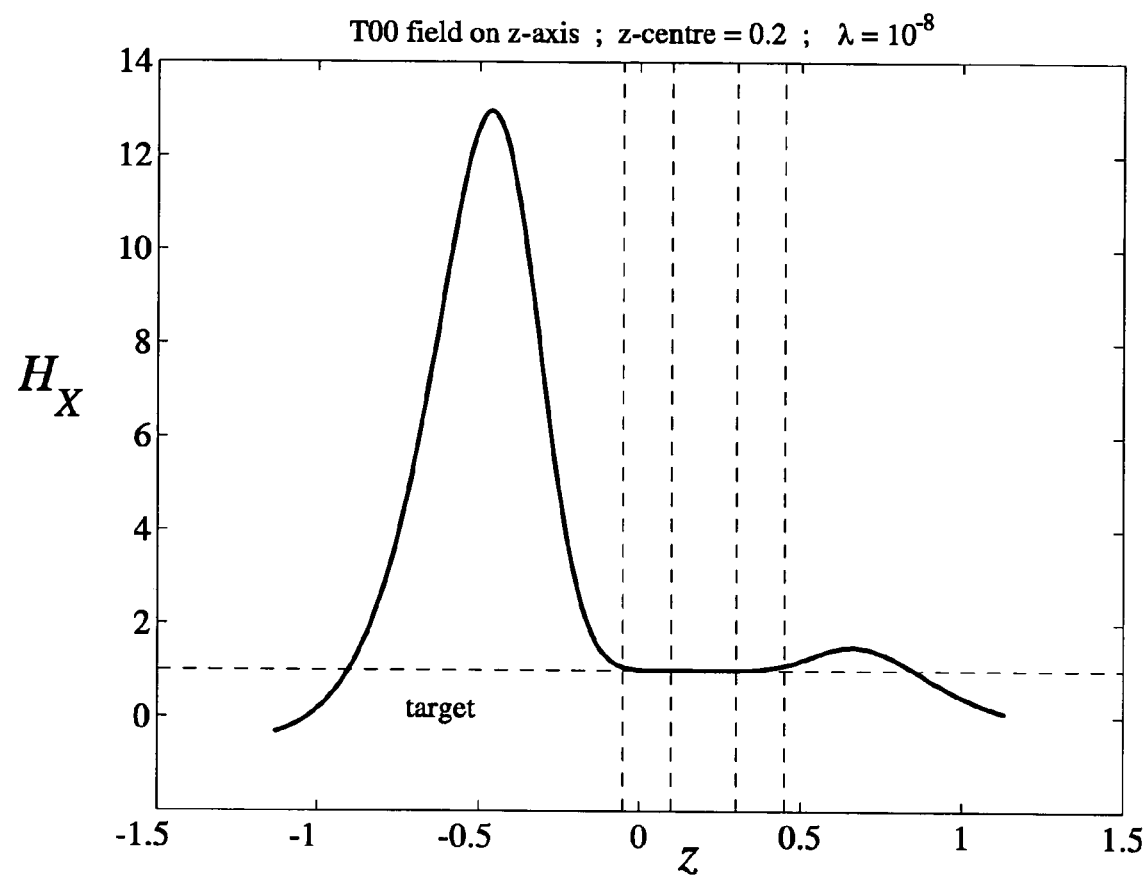

FIG. 13 shows the $H_X$ field on a portion of the z-axis, obtained with the shielded coil of FIG. 12. The target field is indicated by the horizontal dashed line on the figure. The vertical dashed lines indicate the locations of the two pairs of target radii that define the DSV in this case.

Figure 14A:
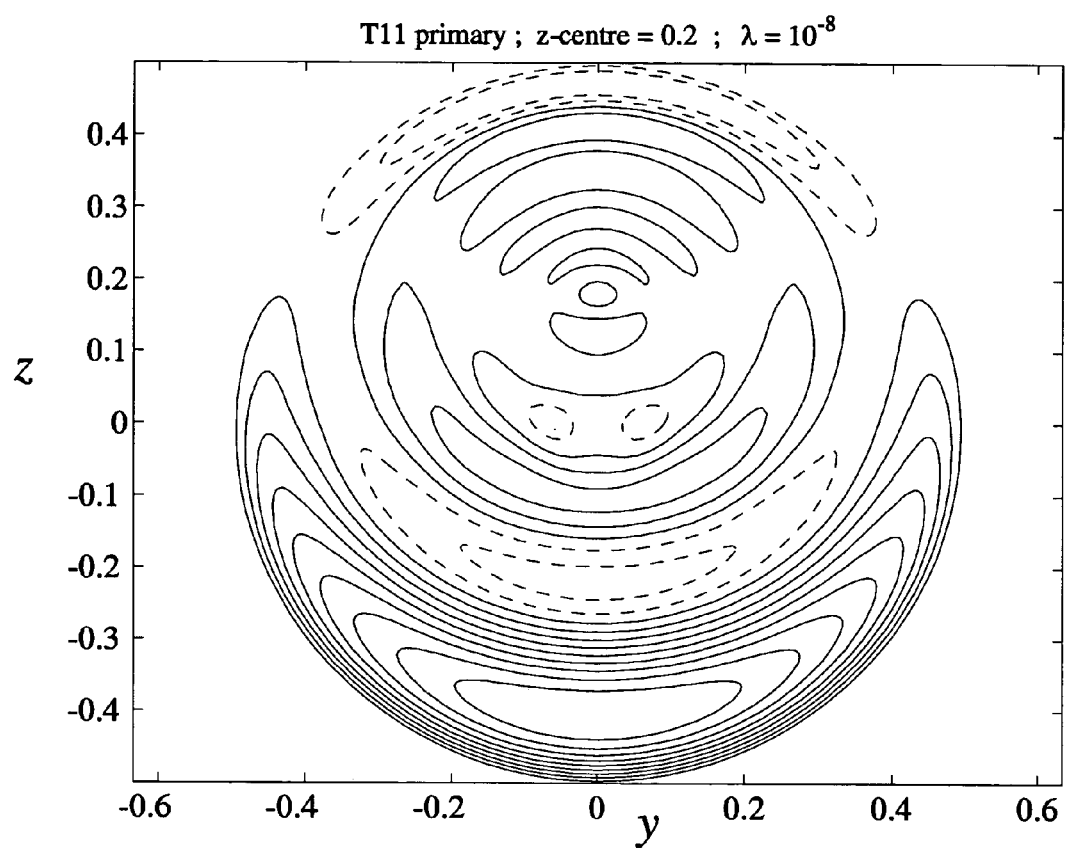
Figure 14B:
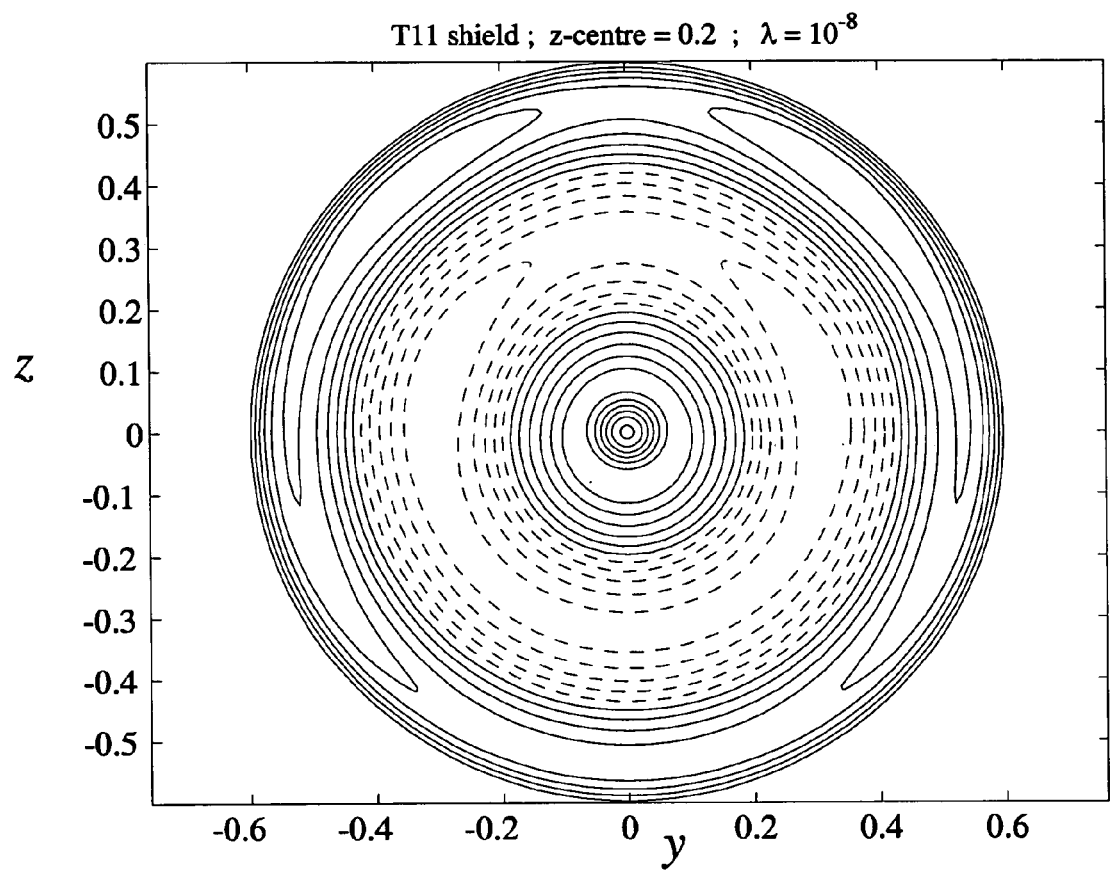

FIG. 14 shows winding patterns for a $T_{11}$ asymmetric linear x-gradient coil, for (a) the primary coil (FIG. 14A), and (b) the shield (FIG. 14B). One winding pattern is shown for each coil, the other winding pattern being the same. The parameters used in this calculation are a=0.4, b=0.6, R=0.5 and S=0.6 meter and $H_{max}=1$ Amp/meter. The target zones are defined by the parameters $c_1=0.25$, $c_2=0.1$, $z_c=0.2$ meter, and $c_3=1.5$ meter. Dashed lines indicate windings carrying reverse current.

Figure 15:
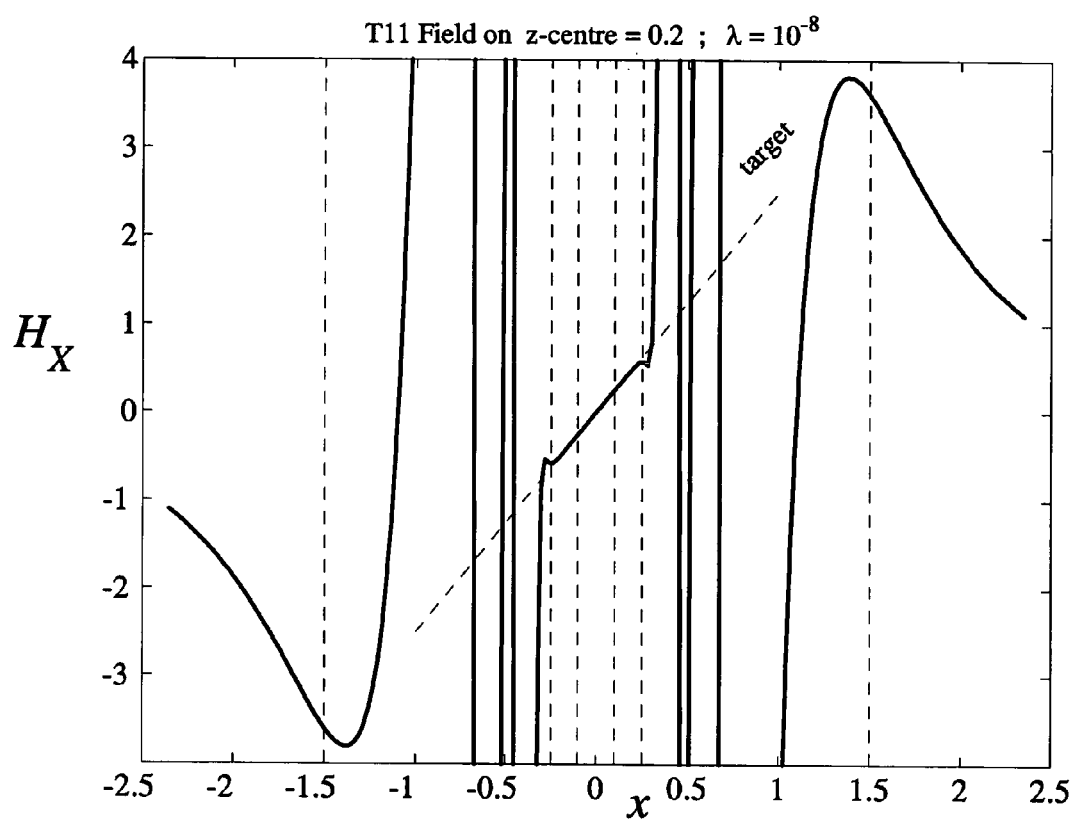

FIG. 15 shows the $H_X$ field on a portion of the line $z=z_c$ on the plane y=0, obtained with the shielded coil of FIG. 14. The target field is indicated by the straight line drawn with a dashed line on the figure. The vertical dashed lines indicate the locations of the three pairs of target zones.

Figure 16:
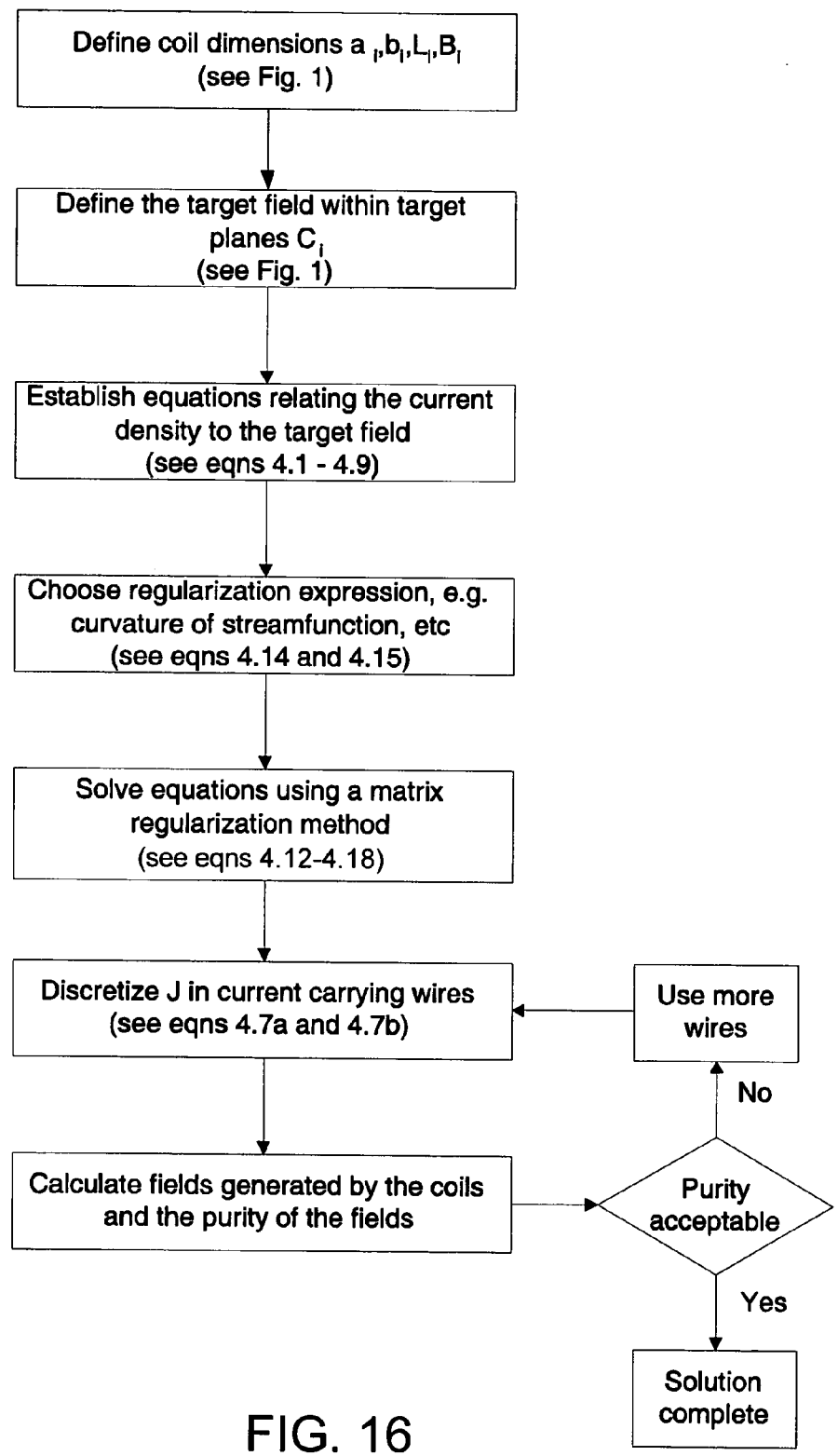

FIG. 16 is a flow chart useful in describing and understanding the steps of the method aspects of the invention.

Figure 17A:
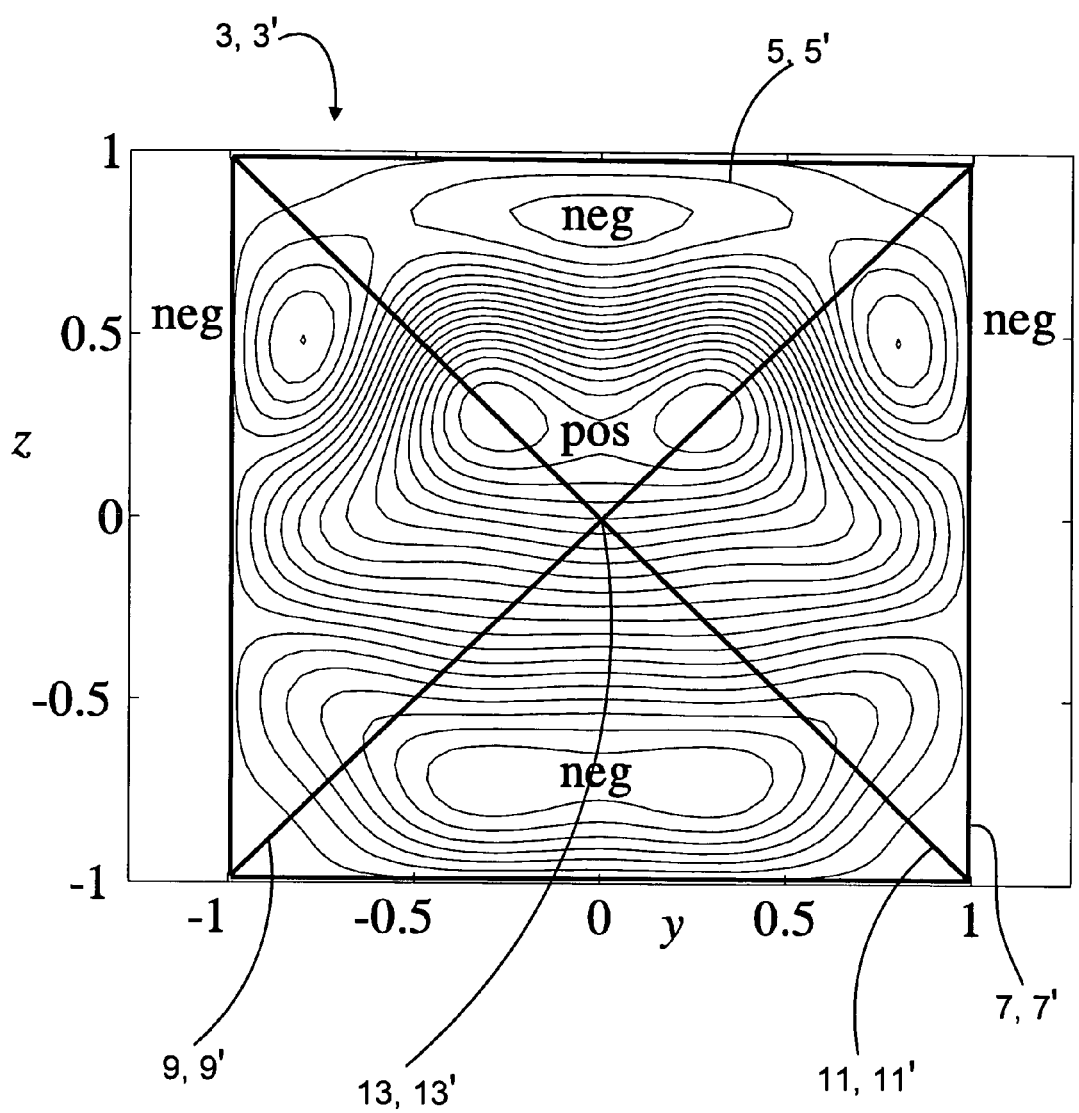
Figure 17B:
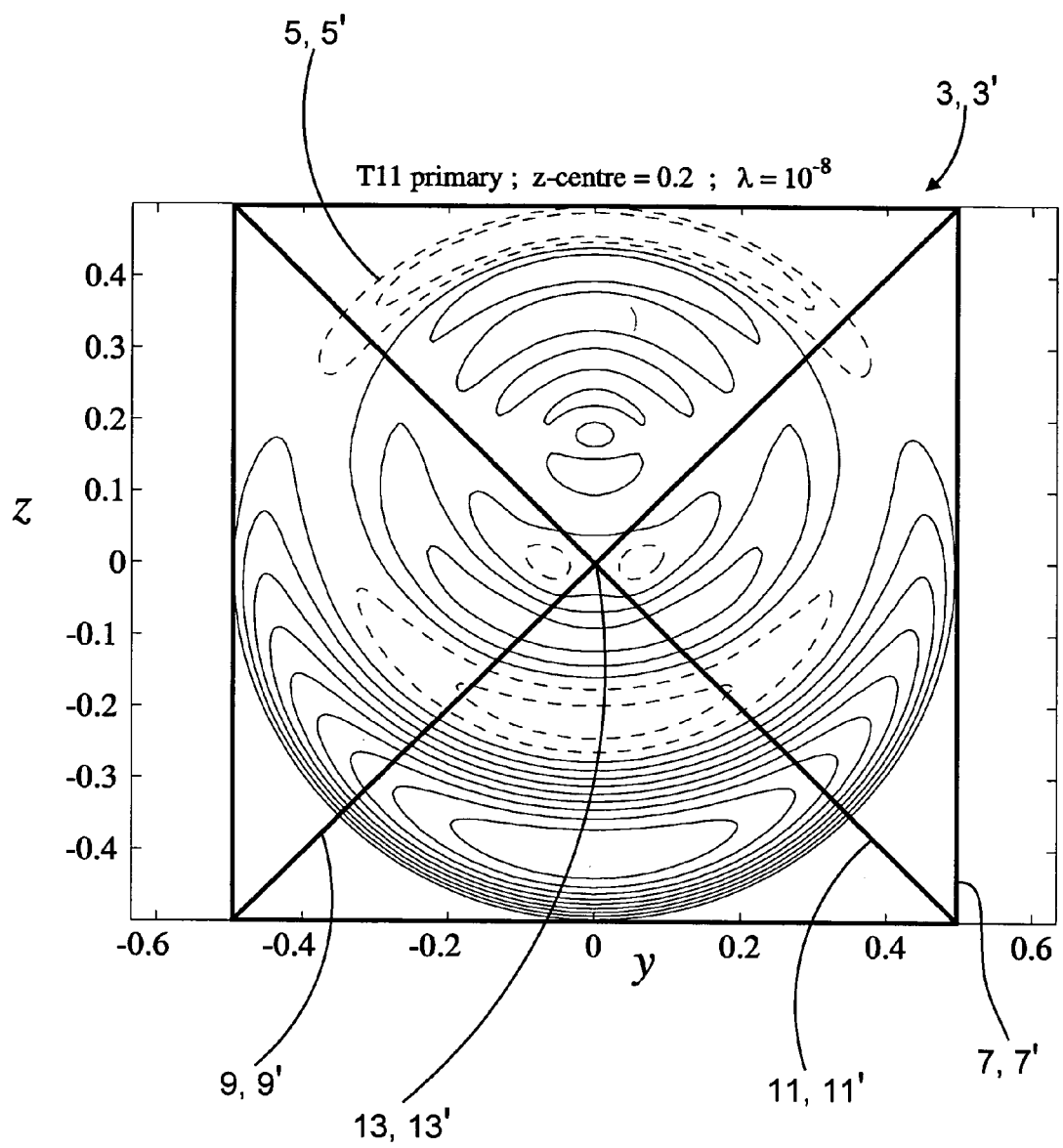

FIG. 17 illustrates enclosing the windings of bi-planar coil assemblies with smallest area rectangles. FIG. 17A illustrates this process for a shim coil and FIG. 17B illustrates it for a gradient coil.

Figure 18A:
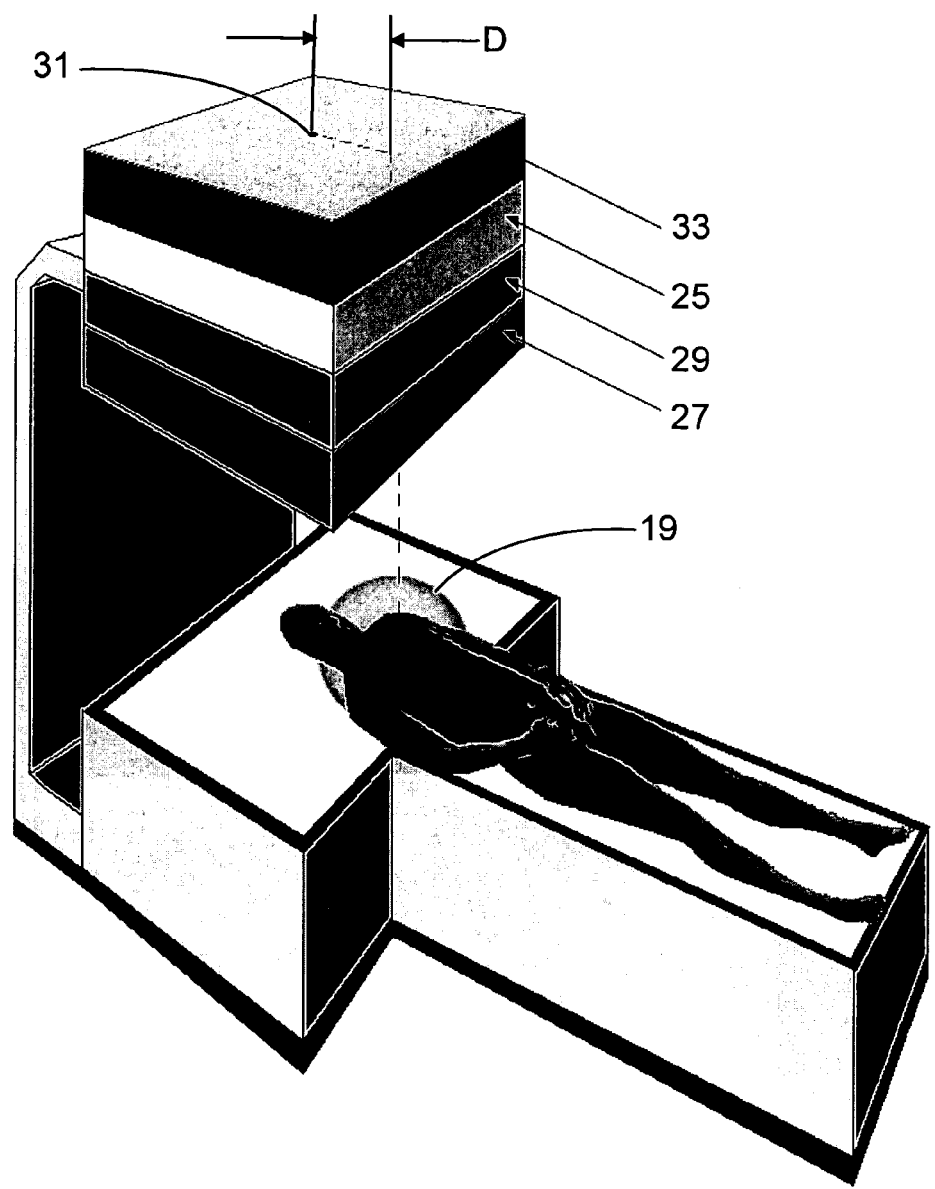
Figure 18B:
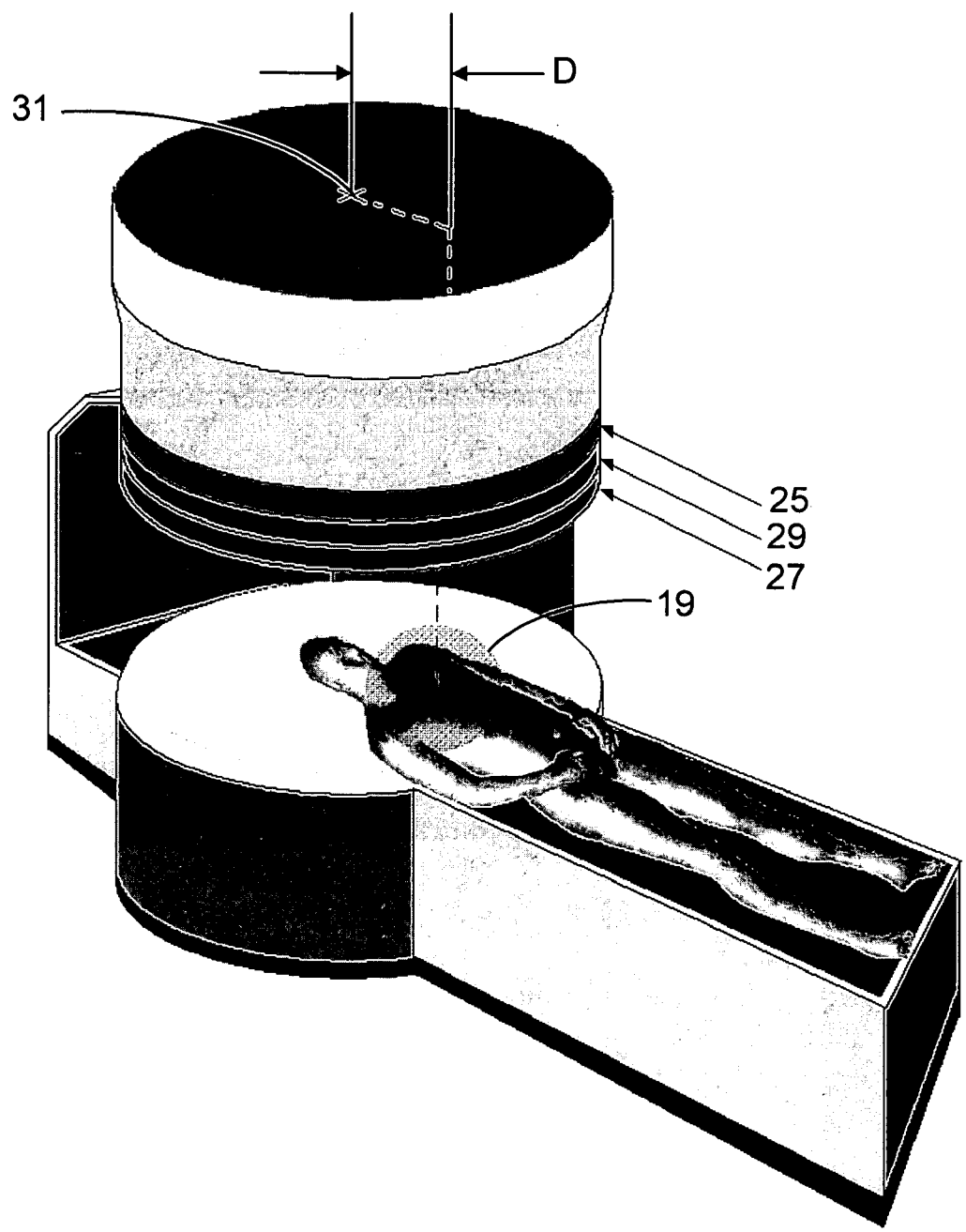

FIGS. 18A and 18B are perspective drawings illustrating magnetic resonance systems employing bi-planar coil assemblies of the invention. In FIG. 18A, the windings have a substantially square perimeter, while in FIG. 18B, they have a substantially circular perimeter. Only the upper set of bi-planar coils are explicitly shown in FIG. 18, the lower set being located in the cabinetry below the subject. FIG. 18A also illustrates the use of a cooling system 33, e.g., a cooling system for use with windings composed of superconducting or non-superconducting materials.

4. DETAILED DESCRIPTION OF EMBODIMENTS OF THE INVENTION

As discussed above, the present invention relates to bi-planar coils having prescribed properties, and methods for designing these and other types of coils. FIG. 16 illustrates the overall numerical procedure of the invention with reference to the various equations presented below.

The method aspects of the invention are preferably practiced on a digital computer system configured by suitable programming to perform the various computational steps. The programming can be done in various programming languages known in the art. A preferred programming language is the C language which is particularly well-suited to performing scientific calculations. Other languages which can be used include FORTRAN, BASIC, PASCAL, $C^{++}$, and the like. The program can be embodied as an article of manufacture comprising a computer usable medium, such as a magnetic disc, an optical disc, or the like, upon which the program is encoded.

The computer system can comprise a general purpose scientific computer and its associated peripherals, such as the computers and peripherals currently being manufactured by IBM, HEWLETT-PACKARD, SUN MICROSYSTEMS, SGI, DELL or the like. For example, the numerical procedures of the invention can be implemented in C-code and performed on a personal computer. The system should include means for inputting data and means for outputting the results of the coil design both in electronic and visual form. The output can also be stored on a disk drive, tape drive, or the like for further analysis and/or subsequent display.

The general design philosophy of Forbes and Crozier (Asymmetric tesseral shim coils for magnetic resonance imaging applications, U.S. Pat. No. 6,664,879) and Forbes and Crozier (2002, *A novel target-field method for magnetic resonance shim coils: Part* 3 *Shielded gradient and shim coils*, J. Phys. D: Appl. Phys. 36, 333—333), the contents of both of which in their entireties are incorporated herein by reference, is applied to the design of bi-planar coils. Depending on the type of field required, the windings on the opposing parallel plates of the bi-planar coil may be either counter-wound or else wound in phase, and shields may also be present. The required target field may be placed at an arbitrary asymmetric location within the coil. The finite size of each coil is explicitly accounted for.

4.1 The Basic Design Approach

Figure 1:
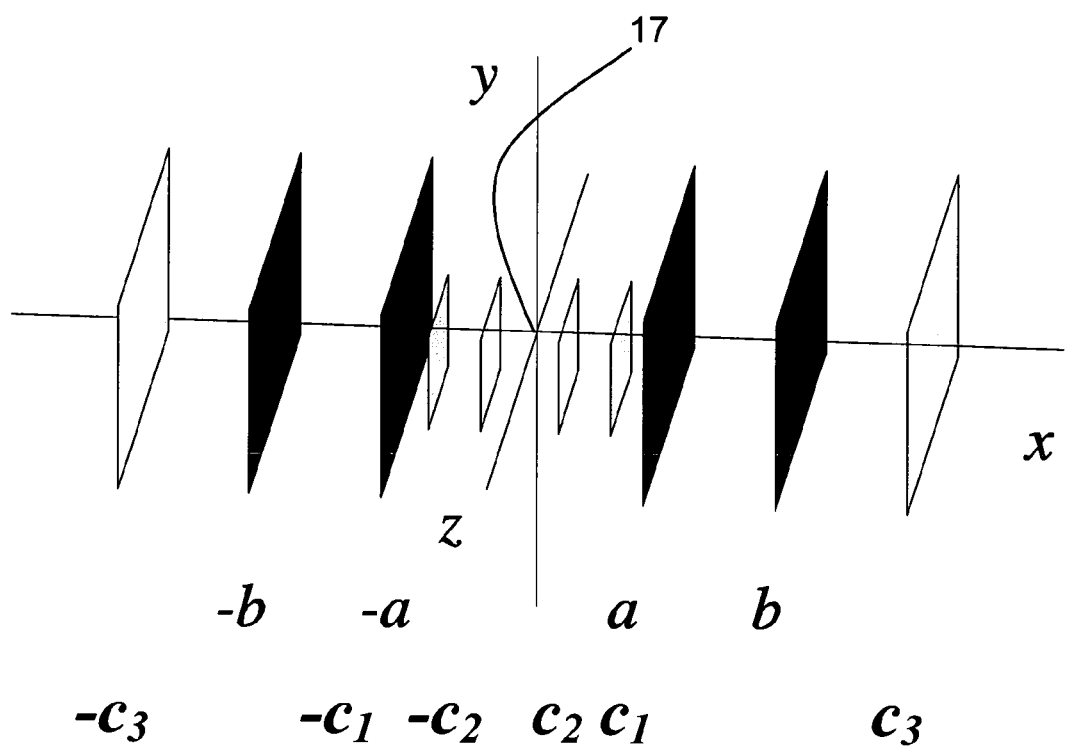

The geometry of the coils and of the target locations is shown in FIG. 1.

The primary coils are located on the parallel planes $x=\pm a$. These coils are taken here to be rectangular in shape, and to occupy the region $-L \leq y \leq L$, $-B \leq z \leq B$. Shielding coils are also shown in FIG. 1, and these are located on the two planes $x=\pm b$. Again, they are assumed to have rectangular geometry, occupying the region $-r_Y L \leq y \leq r_Y L$, $-r_Z B \leq z \leq r_Z B$. Here, the two constants $r_Y$ and $r_Z$ are dimensionless scaling ratios (relative to the size of the primary coils). Although shown as rectangular in FIG. 1, the coils can have any other configuration which is amendable to a mathematical description. For example, as discussed below, circularly-shaped coils can be designed by the methods of the invention.

The target zones are also indicated in FIG. 1. Preferably, the target field is specified on two sets of inner planes, following Forbes and Crozier (Asymmetric tesseral shim coils for magnetic resonance imaging applications, U.S. Pat. No. 6,664,879) and Forbes and Crozier (2002, *A novel target-field method for magnetic resonance shim coils: Part* 3 *Shielded gradient and shim coils*, J. Phys. D: Appl. Phys. 36, 333–333), since this provides the opportunity for greater accuracy in matching the desired target field. The two sets of inner target zones are located on the planes $x=\pm c_1$, $x=\pm c_2$ with $0<c_2<c_1<a$. Each of these target zones is specified on the rectangular region $-\alpha_T L \leq y \leq \alpha_T L$, $pB<z<qB$, in which the dimensionless numbers p and q satisfy the constraints $-1<p<q<1$.

There is also an outer target zone, located on the parallel planes $x=\pm c_3$, as shown in the diagram in FIG. 1. On this region, the imposed target field is zero, representing the effects of the shields. These target zones are again taken to be rectangular in shape, and to lie over the area $-\beta L \leq y \leq \beta L$, $-\gamma B \leq z \leq \gamma B$. The constants $\beta$ and $\gamma$ are again dimensionless scaling ratios.

The symbol $H_{x,y,z}$ (amps/meter) is used to denote the magnetic field vector at a field point $r=x,y,z$) either inside or outside the coil. On either the primary or the shield coil, there is a current-density sheet $j^{(\pm a)}(y', z')$ (amps/meter) at the source point $r'=(\pm a, y', z')$ on the primary coil, or $j^{(\pm b)}(y', z')$ at a source point $r'=(\pm b, y', z')$ on the shields. The magnetic field produced by the current sheets in the coil at any field point is then given by the generalized Biot-Savart law $$H(r) = -\frac{1}{2\pi} \int\int_{(\pm a)} \frac{(r-r') \times j^{(\pm a)}(r')}{\|r-r'\|^3} dA' - \frac{1}{2\pi} \int\int_{(\pm b)} \frac{(r-r') \times j^{(\pm b)}(r')}{\|r-r'\|^3} dA'. \quad (4.1)$$

The current density vector has a component in the y-direction and another in the z-direction, and so it can be represented in the form $$j^{(\pm a)}(r') = j_y^{(\pm a)}(y',z')e_y + j_Z^{(\pm a)}(y',z')e_Z \quad (4.2)$$

in which the two vectors $e_y$ and $e_z$ are the usual unit vectors in the y- and z-directions, respectively. A similar notation is used for the current density $j^{(\pm b)}(r')$ on the shields. The magnetic field induced by these current densities is likewise expressed in Cartesian form $$H(r) = H_X(x,y,z)e_x + H_Y(x,y,z)e_y + H_Z(x,y,z)e_z. \quad (4.3)$$

It follows from the continuity equation on both of the primary coil planes that the two components of the current density in equation (4.2) are related through the continuity equation $$\frac{\partial j_Y^{(\pm a)}(y', z')}{\partial y'} + \frac{\partial j_Z^{(\pm a)}(y', z')}{\partial z'} = 0. \quad (4.4)$$

A similar equation holds for the current-density components on the shielding planes.

Equations (4.2) and (4.3) may be substituted into the Biot-Savart law (4.1) to yield expressions for the three components $H_X$, $H_Y$ and $H_Z$ of the magnetic field. The calculation is straightforward, but the final equations are lengthy and so all three will not be written out in full here. Instead, the general design technique of this invention will be illustrated by reference only to the transverse $H_X$ component, and coils will be designed to match target fields specified on this component of the magnetic field. Nevertheless, it will be understood by those skilled in the art that the method presented here is capable of being applied equally to any of the three magnetic field components $H_X$, $H_Y$ or $H_Z$, or indeed to some linear combination of all three.

The first component of the magnetic field is given from equation (4.1) by the expression $$H_X(x, y, z) = -\frac{1}{2\pi}\int_{-B}^{B}\int_{-L}^{L}\frac{[(y-y')j_Z^{(a)}(y',z') - (z-z')y_Y^{(a)}(y',z')]}{[(x-a)^2+(y-y')^2+(z-z')^2]^{3/2}}dy'dz' \quad (4.5)$$

$$-\frac{1}{2\pi}\int_{-B}^{B}\int_{-L}^{L}\frac{[(y-y')j_Z^{(-a)}(y',z') - (z-z')y_Y^{(-a)}(y',z')]}{[(x+a)^2+(y-y')^2+(z-z')^2]^{3/2}}dy'dz'$$

$$-\frac{1}{2\pi}\int_{-r_Z B}^{r_Z B}\int_{-r_Y L}^{r_Y L}\frac{[(y-y')j_Z^{(b)}(y',z') - (z-z')y_Y^{(b)}(y',z')]}{[(x-b)^2+(y-y')^2+(z-z')^2]^{3/2}}dy'dz'$$

$$-\frac{1}{2\pi}\int_{-r_Z B}^{r_Z B}\int_{-r_Y L}^{r_Y L}\frac{[(y-y')j_Z^{(-b)}(y',z') - (z-z')y_Y^{(-b)}(y',z')]}{[(x+b)^2+(y-y')^2+(z-z')^2]^{3/2}}dy'dz'.$$

As discussed above, similar expressions are also obtained for the other two components of the magnetic field vector. For example the methods of this invention have also been used to design coils for generating target $H_Y$ fields (results not shown).

Depending upon the type of field desired, the bi-planar coils are either counter-wound or else wound in phase. If the chosen target field has odd symmetry in x, then the windings on opposing planes must be counter-wound, so that $$j^{(-a)}(y',z')=-j^{(a)}(y',z') \text{ and } j^{(-b)}(y',z')=-j^{(b)}(y',z') \text{ for odd fields.} \quad (4.6a)$$

Alternatively, if the target field has even symmetry in x, then the opposing planes of the primary and shield coils are wound in phase. This is expressed by the mathematical relationships $$j^{(-a)}(y',z')=j^{(a)}(y',z') \text{ and } j^{(-b)}(y',z')=j^{(b)}(y',z') \text{ for even fields.} \quad (4.6b)$$

Once the particular target field has been chosen, either expression (4.6a) for an odd target field or (4.6b) for an even field is substituted into the relation (4.5). This results in an integral equation for designing the current densities on the coil, when the desired magnetic field component $H_X$ is specified in advance.

4.2 The Streamfunction, and a Method for Representing the Solution

The continuity equation (4.4) on the primary coils permits a streamfunction $\psi^{(a)}(y',z')$ to be defined immediately, by means of the relations $$j_Y^{(a)} = \frac{\partial \psi^{(a)}}{\partial z'} \quad (4.7a)$$

$$j_Z^{(a)} = -\frac{\partial \psi^{(a)}}{\partial y'} \text{ on } x = a.$$

It can be seen that equation (4.7a) satisfies the continuity condition (4.4) identically. An equation similar to (4.4) also holds on the shield coils, and likewise leads to the definition of a second streamfunction $\psi^{(b)}(y',z')$ from the equations $$j_Y^{(b)} = \frac{\partial \psi^{(b)}}{\partial z'} \quad (4.7b)$$

$$j_Z^{(b)} = -\frac{\partial \psi^{(b)}}{\partial y'} \text{ on } x = b.$$

These streamfunctions are dimensionally equivalent to currents, and it has been shown (Brideson, Forbes and Crozier; *Determining complicated winding patterns for shim coils using streamfunctions and the target-field method*, Concepts in Mag. Reson. 14, 9–18, 2002) that contours of the streamfunctions immediately give the required winding patterns on the coils.

It may be shown that the two current density components and the streamfunction on the primary coils can be represented to any desired accuracy by the mathematical expressions $$j_Y^{(a)}(y',z') = \sum_{n=1}^{N}\sum_{m=1}^{M} P_{nm}^{(a)} \sin\left(\frac{m\pi(y'+L)}{2L}\right)\cos\left(\frac{n\pi(z'+B)}{2B}\right) \quad (4.8)$$

$$j_Z^{(a)}(y',z') = -\sum_{n=1}^{N}\sum_{m=1}^{M} P_{nm}^{(a)}\frac{mB}{nL}\cos\left(\frac{m\pi(y'+L)}{2L}\right)\sin\left(\frac{n\pi(z'+B)}{2B}\right)$$

$$\psi^{(a)}(y',z') = \sum_{n=1}^{N}\sum_{m=1}^{M} P_{nm}^{(a)}\frac{2B}{n\pi}\sin\left(\frac{m\pi(y'+L)}{2L}\right)\sin\left(\frac{n\pi(z'+B)}{2B}\right)$$

on $-L \le y' \le L, -B \le z' \le B$.

Here, the sets of coefficients $P_{nm}^{(a)}$ are to be determined, and the integers N and M may be chosen as large as is required for purposes of numerical accuracy. The three expressions in equations (4.8) satisfy the continuity equation (4.4) and the two relations in equation (4.7a). In addition, it can be seen that $j_Y^{(a)} \equiv 0$ on $y' = \pm L$ and $j_Z^{(a)} \equiv 0$ on $z' = \pm B$, as is required on physical grounds. The streamfunction $\psi^{(a)}$ vanishes on all four boundaries of the rectangular primary coil.

Similarly, the two components of the current density and the streamfunction on the shielding coils can be found from the analogous formulae $$j_Y^{(b)}(y', z') = \sum_{n=1}^{N}\sum_{m=1}^{M} P_{nm}^{(b)} \sin\left(\frac{m\pi(y' + r_Y L)}{2 r_Y L}\right) \cos\left(\frac{n\pi(z' + r_Z B)}{2 r_Z B}\right) \quad (4.9)$$

$$j_Z^{(b)}(y', z') = -\sum_{n=1}^{N}\sum_{m=1}^{M} P_{nm}^{(b)} \frac{m r_Z B}{n r_Y L} \cos\left(\frac{m\pi(y' + r_Y L)}{2 r_Y L}\right) \sin\left(\frac{n\pi(z' + r_Z B)}{2 r_Z B}\right)$$

$$\psi^{(b)}(y', z') = \sum_{n=1}^{N}\sum_{m=1}^{M} P_{nm}^{(b)} \frac{2 r_Z B}{n\pi} \sin\left(\frac{m\pi(y' + r_Y L)}{2 r_Y L}\right) \sin\left(\frac{n\pi(z' + r_Z B)}{2 r_Z B}\right)$$

on $-r_Y L \le y' \le r_Y L$, $-r_Z B \le z' \le r_Z B$.

Again, the sets of coefficients $P_{nm}^{(b)}$ are to be determined.

4.3 The Numerical Solution—Illustration for Anti-symmetric Target Fields

As has been previously discussed, in connection with equations (4.6), the method of this invention has been applied to the design of coils that produce magnetic fields that are either symmetric or anti-symmetric with respect to x. This requires bi-planar coils that are either wound in phase or counter-wound, respectively. Both types of coil are of interest, but for brevity only counter-wound coils and their resulting anti-symmetric fields will be illustrated here.

For anti-symmetric fields, the relationship between the current densities on the left and right planes of the bi-planar coils (and their shields) is that given by equation (4.6a). When this expression and the formulae (4.8) and (4.9) are substituted into the integral relation (4.5), it is possible to derive a formal relationship between the magnetic field component and the sets of unknown coefficients $P_{nm}^{(a)}$ and $p_{nm}^{(b)}$. Equation (4.5) becomes $$H_X(x, y, z) = \sum_{n=1}^{N}\sum_{m=1}^{M} P_{nm}^{(a)} W_{nm}^X(x, y, z; a, L, B) + \quad (4.10)$$

$$P_{nm}^{(b)} W_{nm}^X(x, y, z; b, r_Y L, r_Z B).$$

The functions in this expression are defined to be $$W_{nm}^X(x, y, z; a, L, B) = \quad (4.11)$$

$$\frac{1}{2\pi}\int_{-B}^{B}\int_{-L}^{L}\left[\frac{mB}{nL}(y - y')\cos\left(\frac{m\pi(y' + L)}{2L}\right)\sin\left(\frac{n\pi(z' + B)}{2B}\right) + \right.$$

$$\left.(z - z')\sin\left(\frac{m\pi(y' + L)}{2L}\right)\cos\left(\frac{n\pi(z' + B)}{2B}\right)\right] \times$$

$$\left\{\frac{1}{[(x - a)^2 + (y - y')^2 + (z - z')^2]^{3/2}} - \right.$$

$$\left.\frac{1}{[(x + a)^2 + (y - y')^2 + (z - z')^2]^{3/2}}\right\} dy' dz'.$$

and a corresponding expression for $W_{nm}^X(x,y,z;b,r_Y L,r_Z B)$.

Equation (4.10) is of little practical value in its present form, however, since it is both over-determined and ill-conditioned. This is a well-known difficulty with inverse problems of this type, and is documented extensively in the literature. (See, for example, Delves and Mohamed, *Computational Methods for Integral Equations*, Cambridge University Press, Cambridge 1985). (For even target fields, where the bi-planar coils are wound in phase, the only change needed in the above is to replace the minus sign before the last term of equation (4.11) with a plus sign).

As in Forbes and Crozier (Asymmetric tesseral shim coils for magnetic resonance imaging applications, U.S. Pat. No. 6,664,879) and Forbes and Crozier (2002, *A novel target-field method for magnetic resonance shim coils: Part 3 Shielded gradient and shim coils*, J. Phys. D: Appl. Phys. 36, 333—333), the coefficients in equation (4.10) are determined using least-squares minimization and a regularization strategy. The desired target field on the inner two sets of target planes $x=\pm c_1$ and $x=\pm c_2$ shown in FIG. 1 is written as $$H_{TX}(c_i;y,z) \equiv H_X(c_i,y,z) \text{ for } i=1,2.$$

There is also a third target field on the outer set of planes at $x=\pm c_3$, namely $$H_{TX}(c_3;y,z) \equiv H_X(c_3,y,z) = 0.$$

A total error function G is now defined, and takes the form $$G(P_{nm}^{(a)}, P_{nm}^{(b)}) = E_1 + E_2 + E_3 + \lambda^{(a)} F^{(a)} + \lambda^{(b)} F^{(b)}. \quad (4.12)$$

In this expression, the first three terms on the right-hand side represent the squared error in the satisfaction of the governing equation (4.10) on the three sets of target planes shown in FIG. 1. These terms may be written $$E_i(P_{nm}^{(a)}, P_{nm}^{(b)}) = \quad (4.13)$$

$$\int\int_T \left[H_{TX}(c_i; y, z) - \sum_{n=1}^{N}\sum_{m=1}^{M} P_{nm}^{(a)} W_{nm}^X(c_i, y, z; a, L, B) - \right.$$

$$\left.\sum_{n=1}^{N}\sum_{m=1}^{M} P_{nm}^{(b)} W_{nm}^X(c_i, y, z; b, r_Y L, r_Z B)\right]^2 dy\, dz,\ i = 1, 2, 3.$$

The symbol T beneath the integrals in equation (4.13) refers to the target zone on each plane $x=\pm c_i$, $i=1,2,3$, as indicated in FIG. 1 and described above.

The remaining two terms on the right-hand side of equation (4.12) are penalty terms in the regularization process, and these may be chosen largely at the discretion of the designer. Thus the two constants $\lambda^{(a)}$ and $\lambda^{(b)}$ are regularization parameters; they should be chosen to be small enough to ensure that the expression (4.10) is still represented to a high degree of accuracy, but nevertheless large enough to give a well-conditioned system of equations. It has been found that values of the order of $10^{-12}$ are appropriate to this purpose. In addition, the two functions $F^{(a)}$ and $F^{(b)}$ are penalty functions. They can be chosen by the designer to correspond to physical parameters, such as the inductance of the coil or the power it consumes, and minimized accordingly, as part of the system (4.12).

In this embodiment of the invention, as in Forbes and Crozier (Asymmetric tesseral shim coils for magnetic resonance imaging applications, U.S. Pat. No. 6,664,879) and Forbes and Crozier (2002, *A novel target-field method for magnetic resonance shim coils: Part 3 Shielded gradient and shim coils*, J. Phys. D: Appl. Phys. 36, 333–333), slightly more abstract penalty functions $F^{(a)}$ and $F^{(b)}$ are used. Here, the total squares of the curvatures of the streamfunctions on the primary and shield coils are chosen, for the reason that minimizing these quantities is equivalent to making the winding patterns on each coil as smooth as possible. Coils with this property are expected to be more amenable to practical manufacture. Thus, in this embodiment of the invention, the penalty function on the primary is $$F^{(a)} = \iint_{(x=a)} |\nabla^2 \psi^{(a)}|^2 dA. \qquad (4.14)$$

The penalty function for the shield coils is defined similarly, with x=a replaced by x=b in equation (4.14). The expressions (4.8) and (4.9) for the two streamfunctions are inserted into equation (4.14) and equation (4.14) with "a" replaced by "b", and after some algebra, the two curvature penalty functions take the final forms $$F^{(a)} = \sum_{n=1}^{N} \sum_{m=1}^{M} (P_{nm}^{(a)})^2 \frac{n^2\pi^2 L}{4B}\left(1 + \frac{m^2 B^2}{n^2 L^2}\right)^2 \qquad (4.15)$$

$$F^{(b)} = \sum_{n=1}^{N} \sum_{m=1}^{M} (P_{nm}^{(b)})^2 \frac{n^2\pi^2 r_Y L}{4 r_Z B}\left(1 + \frac{m^2 r_Z^2 B^2}{n^2 r_Y^2 L^2}\right)^2.$$

The positive-definite error function G in equation (4.12) is now minimized, by requiring that $$\frac{\partial G}{\partial P_{ij}^{(a)}} = 0 \text{ and } \frac{\partial G}{\partial P_{ij}^{(b)}} = 0, \quad i=1,\ldots,N, \ j=1,\ldots,M. \qquad (4.16)$$

The derivatives of the quantities in equations (4.13) and (4.15) are calculated explicitly, and the system (4.16) then leads to a set of linear algebraic equations for the unknown coefficients $P_{nm}^{(a)}$ and $P_{nm}^{(b)}$. This system can be represented as $$\sum_{n=1}^{N}\sum_{m=1}^{M} \left(C_{ijnm}^{(a)} P_{nm}^{(a)} + C_{ijnm}^{(b)} P_{nm}^{(b)}\right) = R_{ij} \qquad (4.17)$$

$$\sum_{n=1}^{N}\sum_{m=1}^{M} \left(D_{ijnm}^{(a)} P_{nm}^{(a)} + D_{ijnm}^{(b)} P_{nm}^{(b)}\right) = S_{ij},$$

$$i=1,\ldots,N, \ j=1,\ldots,M.$$

Here, the sets of coefficients $$C_{ijnm}^{(a)}$$

and so on, and the right-hand side terms $R_{ij}$ and $S_{ij}$ are obtained in terms of integrals over each target zone It is found that $$C_{ijnm}^{(a)} = \int_{-\alpha_T L}^{\alpha_T L} dy \int_{pB}^{qB} dz\, [W_{ij}^X(c_1, y, z; a, L, B)W_{nm}^X(c_1, y, z; a, L, B) +$$

$$W_{ij}^X(c_2, y, z; a, L, B)W_{nm}^X(c_2, y, z; a, L, B)] +$$

$$\int_{-\beta L}^{\beta L} dy \int_{-\gamma B}^{\gamma B} dz W_{ij}^X(c_3, y, z; a, L, B)W_{nm}^X(c_3, y, z; a, L, B) +$$

$$\lambda^{(a)} \delta_{in}\delta_{jm} \frac{i^2\pi^2 L}{4B}\left(1+\frac{j^2 B^2}{i^2 L^2}\right)^2,$$

in which the symbol $\delta_{in}$ takes the value 1 when its two indices are equal and 0 otherwise. In addition, it may be determined that $$R_{ij} = \int_{-\alpha_T L}^{\alpha_T L} dy \int_{pB}^{qB} dz [H_{TX}(c_1; y, z)W_{ij}^X(c_1, y, z; a, L, B) +$$

$$H_{TX}(c_2; y, z)W_{ij}^X(c_2, y, z; a, L, B)] +$$

$$\int_{-\beta L}^{\beta L} dy \int_{-\gamma B}^{\gamma B} dz H_{TX}(c_3; y, z)W_{ij}^X(c_3, y, z; a, L, B).$$

The remaining coefficients in equation (4.17) have similar forms to these, although they are lengthy expressions and so the full set will not be presented here, in the interests of brevity. The system (4.17) may be represented in block-matrix form as $$\begin{bmatrix} C^{(a)} & C^{(b)} \\ D^{(a)} & D^{(b)} \end{bmatrix}\begin{bmatrix} P^{(a)} \\ P^{(b)} \end{bmatrix} = \begin{bmatrix} R \\ S \end{bmatrix} \qquad (4.18)$$

in which the terms $C^{(a)}$, and so on, in the coefficient matrix are NM×NM matrices, and the remaining quantities are all vectors of length NM. The matrix system (4.18) can be solved by standard software.

In order to use the design method of this invention, it is therefore necessary to evaluate the elements $$C_{ijnm}^{(a)},$$

and so on, that appear in the large 2NM×2NM matrix on the left-hand side of equation (4.18). Each of these terms involves integrals over the appropriate target regions, and these integrals are evaluated using, for example, trapezoidal-rule quadrature. In addition, each of these integrals contains the functions $W_{nm}^X$ defined in equation (4.11) in the integrand; these functions must also be evaluated by numerical quadrature. The solution of equation (4.18) for the coefficients $P_{nm}^{(a)}$ and $P_{nm}^{(b)}$ is therefore a reasonably demanding

4.4 Circular Coils

As will be evident to persons skilled in the art, the approach described above for the design of rectangular bi-planar coils can be extended, based on the above disclosure, to coil shapes that are other than rectangular. To illustrate such an extension, the essential design methodology of this invention is now applied to the case in which the primary and the shield coils are both circular.

The primary coils are now taken to be circular disks of radius R, lying on the planes $x=\pm a$ as before, and the shields are disks of radius S located at $x=\pm b$. The magnetic field $H(r)$ at a field point (with position vector r) is again given by means of the Biot-Savart law (4.1). On the primary coils, the current density is now represented in terms of cylindrical polar coordinates $(r, \theta)$, so that equation (4.2) is replaced by the expression $$j^{(\pm a)}(r') = j_r^{(\pm a)}(r', \theta') e_{r'} + j_\Theta^{(\pm a)}(r', \theta') e_{\theta'}. \tag{4.19a}$$

The current density on the shields is similarly expressed as $$j^{(\pm b)}(r') = j_r^{(\pm b)}(r', \theta') e_{r'} + j_\Theta^{(\pm b)}(r', \theta') e_{\theta'}. \tag{4.19b}$$

The primed variables in equations (4.19) refer to source points, located either on the primary coils or the shield coils respectively, and $e_{r'}$ and $e_{\theta'}$ are unit vectors in the radial and azimuthal directions, measured from the source points.

As in Section 4.2, streamfunctions may be defined, by which the continuity equations on the primary and shield coils may be satisfied identically. In terms of the polar coordinates $(r,\theta)$ appropriate to these circular bi-planar coils, the current density components on the primary coils at $x=\pm a$ may be written in terms of streamfunctions $\psi^{(\pm a)}$ according to the formulae $$j_r^{(\pm a)} = \frac{1}{r'} \frac{\partial \psi^{(\pm a)}}{\partial \theta'} \quad j_\Theta^{(\pm a)} = -\frac{\partial \psi^{(\pm a)}}{\partial r'}, \quad 0 < r' < R. \tag{4.20a}$$

Similarly, on the shield coils at $x=\pm b$, streamfunctions $\psi^{(\pm b)}(r',\theta')$ may be defined from the relations $$j_r^{(\pm b)} = \frac{1}{r'} \frac{\partial \psi^{(\pm b)}}{\partial \theta'} \quad j_\Theta^{(\pm b)} = -\frac{\partial \psi^{(\pm b)}}{\partial r'}, \quad 0 < r' < S. \tag{4.20b}$$

As for the case of rectangular primaries and shields, some appropriate representation is now required for the current densities. On the circular primary coil at $x=a$, the radial current density component may be taken to have the form $$j_r^{(a)}(r', \theta') = \sum_{m=1}^{M} \sum_{n=1}^{N} m \sin\left(\frac{n\pi r'}{R}\right) [-P_{mn}^{(a)} \sin(m\theta') + Q_{mn}^{(a)} \cos(m\theta')]. \tag{4.21a}$$

This function is periodic in the azimuthal coordinate $\theta'$ and is zero at $r'=0$ and $r'=R$, as required by the geometry of the coil. The continuity equation then requires the azimuthal component of the current density to be $$j_\Theta^{(a)}(r', \theta') = -\sum_{n=1}^{N} P_{0n}^{(a)}\left[\sin\left(\frac{n\pi r'}{R}\right) + \left(\frac{n\pi r'}{R}\right)\cos\left(\frac{n\pi r'}{R}\right)\right] - \tag{4.21b}$$

$$\sum_{m=1}^{M} \sum_{n=1}^{N} \left[\sin\left(\frac{n\pi r'}{R}\right) + \left(\frac{n\pi r'}{R}\right)\cos\left(\frac{n\pi r'}{R}\right)\right]$$

$$[P_{mn}^{(a)} \cos(m\theta') + Q_{mn}^{(a)} \sin(m\theta')].$$

The streamfunction for this coil is obtained from the relations (4.20a), and has the form $$\psi^{(a)}(r', \theta') = \sum_{n=1}^{N} P_{0n}^{(a)} r' \sin\left(\frac{n\pi r'}{R}\right) + \tag{4.21c}$$

$$\sum_{m=1}^{M} \sum_{n=1}^{N} r' \sin\left(\frac{n\pi r'}{R}\right) [P_{mn}^{(a)} \cos(m\theta') +$$

$$Q_{mn}^{(a)} \sin(m\theta')].$$

This function is zero on the circumference of the circular primary coil, at $r'=R$.

The sets of coefficients $P_{mn}^{(a)}$ and $Q_{mn}^{(a)}$ in equations (4.21) are as yet unknown, and must be determined from the Biot-Savart law (4.1), as before. Similar formulae to equations (4.21) also describe the current density components and the streamfunction $\psi^{(b)}$ on the shield coil at $x=b$, and can be obtained by replacing R with S and making use of a second set of coefficients $P_{mn}^{(b)}$ and $Q_{mn}^{(b)}$, which are also to be determined.

The Biot-Savart law is now satisfied as before, by minimizing the square of the error between the predicted field in equation (4.1) and some target field $H_{XT}(x,y,z)$. In view of the circular primary and shield coils considered in this section, it is appropriate to match the target field on the surfaces of two concentric spheres $$x^2 + y^2 + (z-z_c)^2 = c_1^2$$

$$x^2 + y^2 + (z-z_c)^2 = c_2^2 \tag{4.22}$$

located between the two primary planes at $x=-a$ and $x=a$. These serve to define a DSV off-set by a distance $z_c$ along the axial z-axis. This is a way in which asymmetrical target fields can be prescribed. The sphere radii satisfy the constraints $c_2 < c_1 < a$. In addition, a zero target field is imposed on disks of radii $\kappa S$ on the planes $x=\pm c_3$, similar to the case of the rectangular coils. Here, the constant $\kappa$ typically has the value 1.2.

As before, this is an extremely ill-conditioned problem, and so must be regularized by the addition of penalty functions, as in Section 4.3. Thus, the design methodology of this invention again proceeds by minimizing an expression of the form $$G(P_{mn}^{(a)}, Q_{mn}^{(a)}, P_{mn}^{(b)}, Q_{mn}^{(b)}) = E_1 + E_2 + E_3 + \lambda^{(a)} F^{(a)} + \lambda^{(b)} F^{(b)}, \tag{4.23}$$

in which the first three terms are the integrals of the squares of differences between the computed and target fields on each of the three target regions described above. In order to simplify the mathematics as much as possible, the two penalty functions $F^{(a)}$ and $F^{(b)}$ have been chosen in this section to be $$F^{(a)} = \int_0^{2\pi} \int_0^R \|j^{(a)}(r', \theta')\|^2 r' dr' d\theta' \quad \text{on } x = a$$

$$F^{(b)} = \int_0^{2\pi} \int_0^S \|j^{(b)}(r', \theta')\|^2 r' dr' d\theta' \quad \text{on } x = b.$$

It will be understood by practitioners in the field that other penalty functions $F^{(a)}$ and $F^{(b)}$ may be chosen, without departing from the spirit of this invention, although at the likely cost of greater mathematical complexity; different penalty functions have already been discussed in Section 4.3.

The expression in equation (4.23) is now minimized with respect to the unknown coefficients, by requiring that $$\frac{\partial G}{\partial P_{0k}^{(a)}} = 0; \frac{\partial G}{\partial P_{jk}^{(a)}} = 0; \frac{\partial G}{\partial Q_{jk}^{(a)}} = 0 \quad (4.24)$$

$$\frac{\partial G}{\partial P_{0k}^{(b)}} = 0; \frac{\partial G}{\partial P_{jk}^{(b)}} = 0; \frac{\partial G}{\partial Q_{jk}^{(b)}} = 0, \; j = 1, \ldots, M, k = 1, \ldots, N.$$

In a similar fashion to that detailed above with regard to equation (4.18), equations (4.24) can be expressed in matrix form and then solved using standard software for solving linear equations.

5. EXEMPLARY RESULTS AND DESIGNS

A. Exemplary Rectangular Designs

The methods described above have been used to design various bi-planar shielded coils. In particular, they have been used to produce symmetrical and asymmetrically-located fields of practical interest. As indicated above, the technique will be illustrated here to design target field components $H_X$ (the component normal to the bi-planar coil surfaces; also referred to herein as "transverse" field components), although it has also been applied successfully to the design of coils for generating target $H_Y$ fields (components parallel to the bi-planar coil surfaces).

The interior target zones are located on the two pairs of planes $x = \pm c_1$, $x = \pm c_2$ and positioned over the rectangular regions $-\alpha_T L \leq y \leq \alpha_T L$, $pB < z < qB$ on each plane. The dimensionless numbers p and q satisfy the constraints $-1 < p < q < 1$. Following Forbes and Crozier (2001, *Asymmetric zonal shim coils for Magnetic Resonance applications*, Med. Phys. 28, 1644–1651), it will prove convenient to locate the target fields asymmetrically with respect to the z-coordinate by defining the new variable $$z_2 = \frac{z}{B} - \frac{p+q}{2}. \quad (5.1)$$

This non-dimensional coordinate is centred with respect to the target field $pB < z < qB$, and it has the advantage that it allows the usual formulae for spherical harmonic target magnetic fields to be used naturally over the target region. A list of these fields may be found in *Magnetic Field Profiling: Analysis and Correcting Coil Design*, Roméo and Hoult, 1984, Magn. Reson. Med. 1 44–65, for both zonal and tesseral target fields.

5.1 Example 1

The $T_{00}$ (Constant Field) Bi-pChecklanar Coil

In this example, the method of the invention is used to design shielded and unshielded bi-planar coils that are intended to produce symmetrically located $T_{00}$ fields within the primary bi-planar coil. For this coil, the target fields are simply constants, and so $H_X$ is simply a constant on each of the three pairs of target planes. We therefore set $$H_{TX}(c_1; y, z) = H_{max}$$

$$H_{TX}(c_2; y, z) = H_{max}$$

$$H_{TX}(c_3; y, z) = 0. \quad (5.2)$$

Here, the constant transverse magnetic field within the primary coils has been assumed to take the value $H_{max} = 1$ amp/meter. The target field at $x = \pm c_3$ is set to zero, reflecting the intended function of the shields. Since the $T_{00}$ field is even in the x-coordinate (it is constant), the primary coil windings on the plane at $x = -a$ are in phase with those on $x = a$, and the same is true for the shields on the planes $x = \pm b$. (This even target field requires the last term in equation (4.11) to take a plus sign).

To begin, the case of an unshielded symmetric coil is first considered. The numerical method is the same as presented in Section 4, except that all the terms involving the Fourier coefficients $P_{nm}^{(b)}$ on the shields are simply removed. Consequently, the matrix system (4.18) is replaced with a smaller block system, which may be solved for a set of coefficients on the primary coil. A smaller block system can be used because only a primary bi-planar coil is employed as opposed to both a primary bi-planar coil and a shielding bi-planar coil. Once these coefficients have been determined, the streamfunction $\psi^{(a)}(y', z')$ is then evaluated using equation (4.8). The appropriate winding patterns to create the desired coil are then obtained immediately, simply by drawing contours of $\psi^{(a)}$ using standard software.

Figure 2:
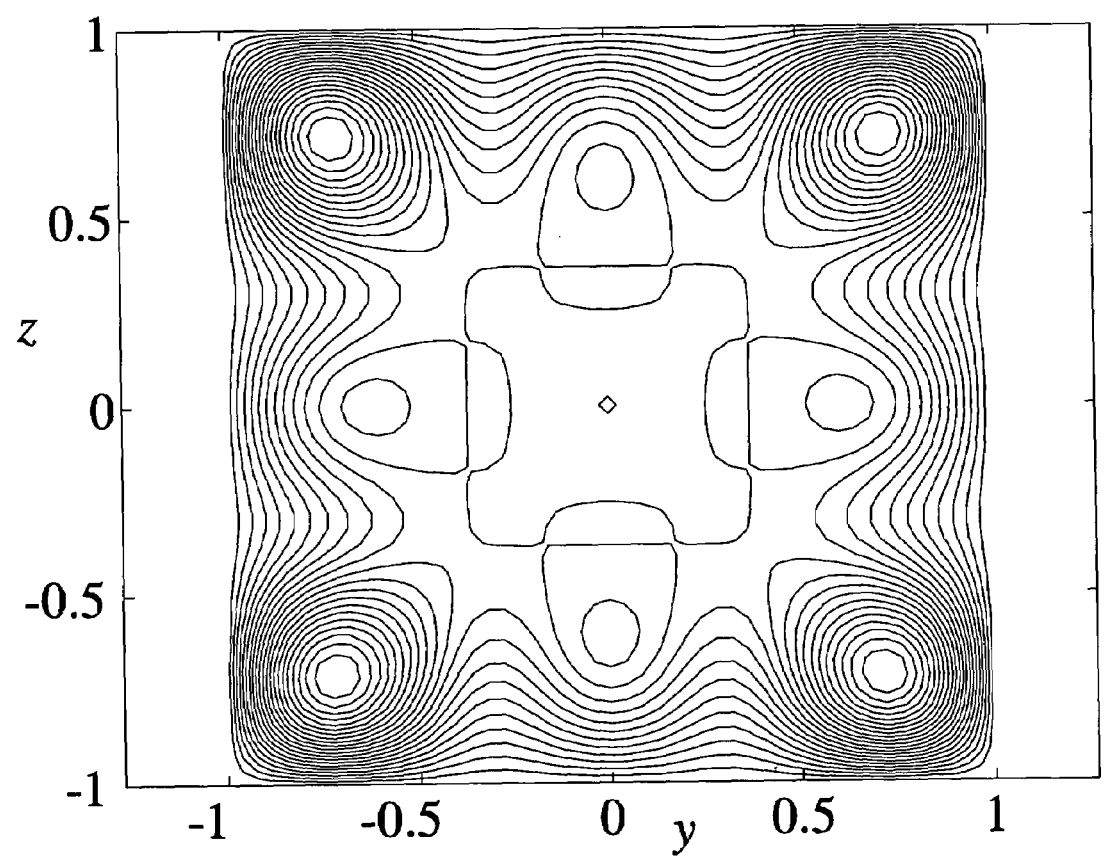

FIG. 2 shows the winding pattern for the unshielded primary, obtained by this method. In this calculation, the plate is taken to be a square (L=B=1 meter) and the primary bi-planar coil is located on the planes $x = \pm a$ with $a = 0.5$ meter. The two interior target zones in equation (5.2) were specified on the sets of planes defined by the conditions $c_1 = 0.35$ and $c_2 = 0.2$ meter, and the target regions $-\alpha_T L \leq y \leq \alpha_T L$ pB<z<qB are chosen to be square and symmetrically located, with $\alpha_T = 0.5$ and p=-0.5, q=0.5. (For an unshielded coil, the zero target field condition on $x = \pm c_3$ in equation (5.2) is omitted). The winding pattern in FIG. 2 is strongly affected by the square geometry of the plates, and approximately circular loops exist in each of the four corners, to compensate for their presence. An interesting square-shaped winding region is also present in the centre of the pattern, with extra winding lobes near each side.

Figure 3A:
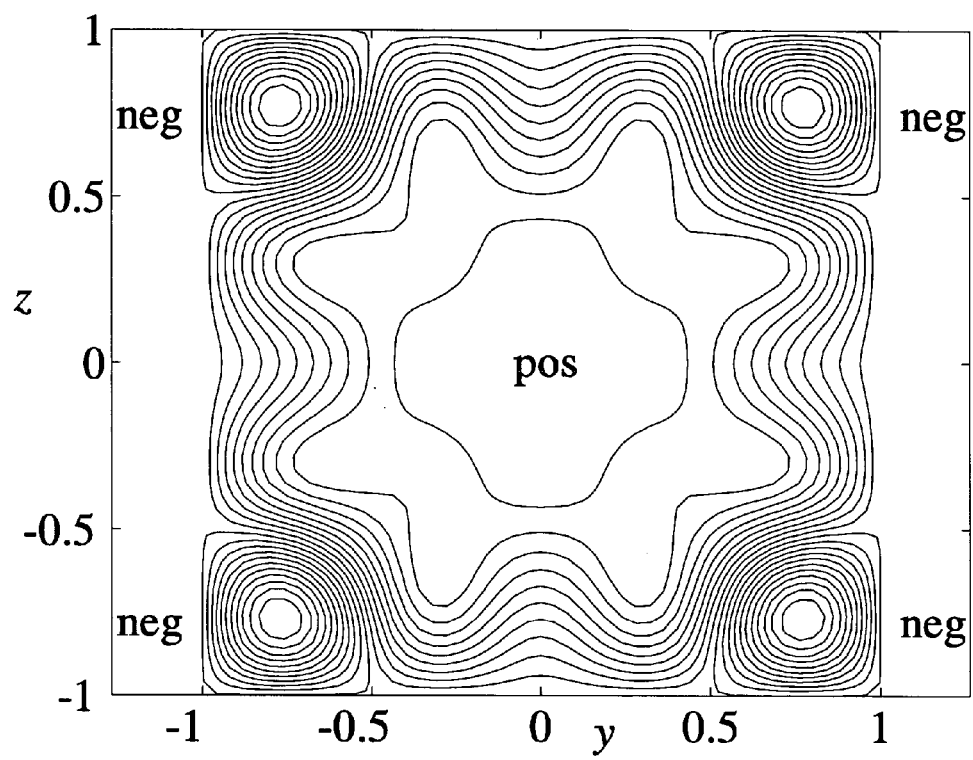

When shields are introduced, the winding pattern changes substantially, because the field is altered by the presence of the shield. FIG. 3A shows the effect on the primary coil of placing shields at b=0.75 meter with zero target fields imposed at $c_3 = 0.9$ meter. These shields are also square and are the same size as the primary coils ($r_y = r_z = 1$). The target region is also of the same size ($\beta = \gamma = 1$). All the other parameters pertaining to the primary coil retain the same values as for FIG. 2, so that this is still a symmetrically located target field. The winding pattern in FIG. 3A has now developed an eight-fold pattern in the centre of the coil. The four regions involving looped windings near each of the corners are still present, as before, but with the important difference that the direction of current in these corner windings is now reversed. Thus there is positive current on the windings in the centre of the primary coil, but negative current in each corner.

Figure 3B:
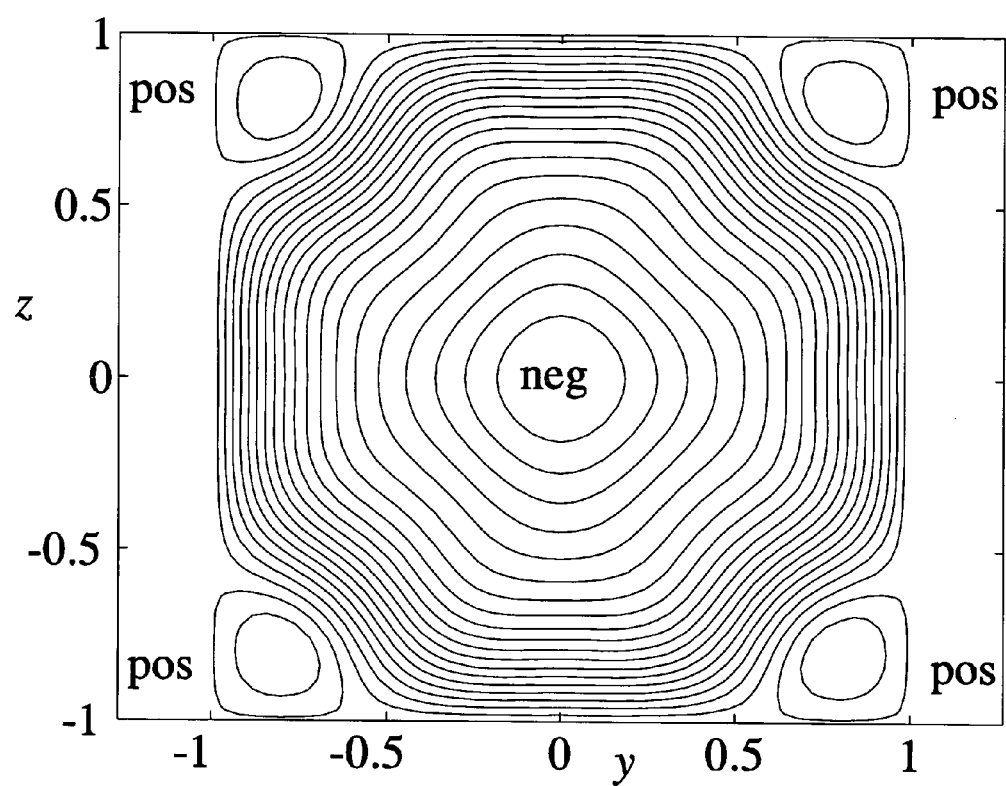

The winding pattern for the shield in this case is shown in FIG. 3B. Here, the current has the opposite polarity to that on the primary, so as to cancel the exterior field as nearly as possible. Thus the large central windings on the shield in FIG. 3B possess negative current, while a small positive current is present on each of the four small corner windings.

Figure 4:
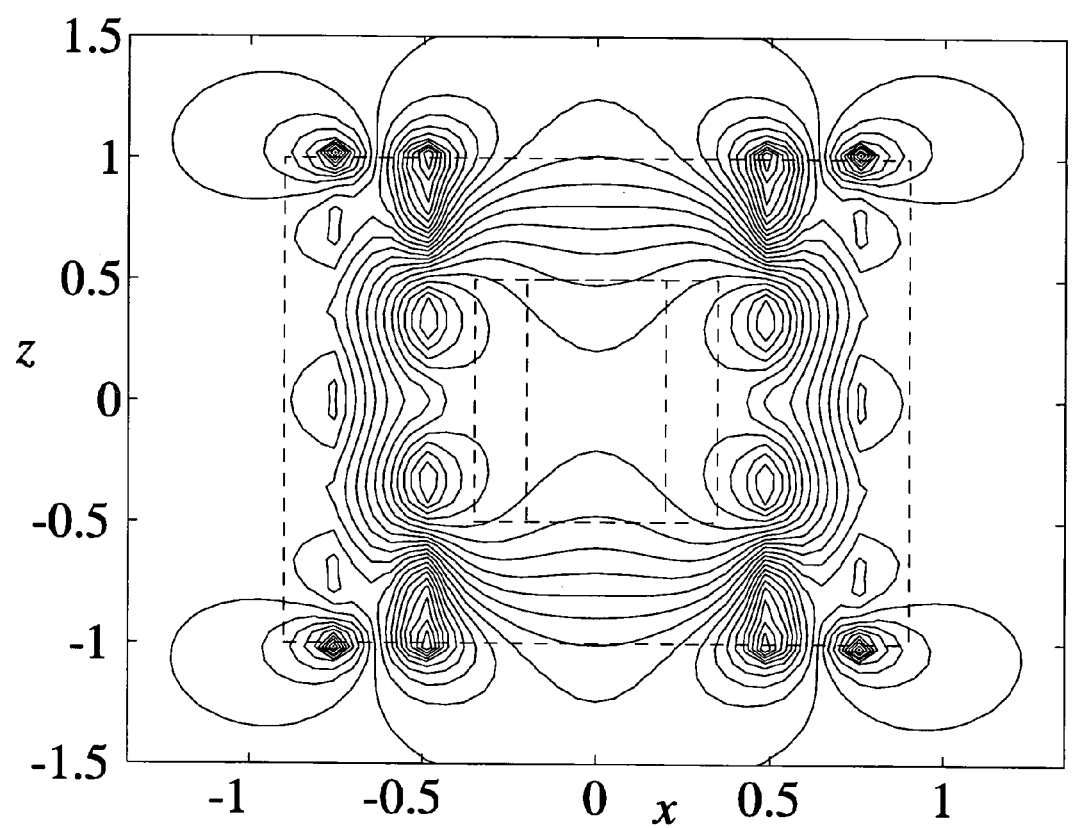
FIG. 4 shows contours for the $H_X$ component of the magnetic field produced by the shielded $T_{00}$ symmetric bi-planar coil of FIG. 3, on the centre-plane y=0. The dashed lines indicate the three target regions.

The effectiveness of this coil can be determined by investigating the magnetic field it produces, with particular reference to the $H_X$ component. Accordingly, this field component has been computed from the Fourier coefficients, using equation (4.10). For ease of viewing, the field $H_X(x, 0,z)$ on the centre-plane $y=0$ is shown in FIG. 4. Here, contours have been drawn at the 5% level. The influence of the primary coils at $x=\pm 0.5$ and the shield coils at $x=\pm 0.75$ is evident from the figure. In addition, the three target zones are indicated with dashed lines on the diagram. The absence of field contours within the two interior planes indicates that the aim of producing a constant strength field in this region has largely been achieved, at least to the 5% level, although there is a small distortion at the top and the bottom of this target zone. Likewise, the absence of field lines beyond the exterior target planes at $x=\pm 0.9$ on the diagram indicates that the shields have been very successful in suppressing lateral fields beyond the coil region, although it is evident that there is considerable field leakage above and below the coil in the figure.

Figure 5:
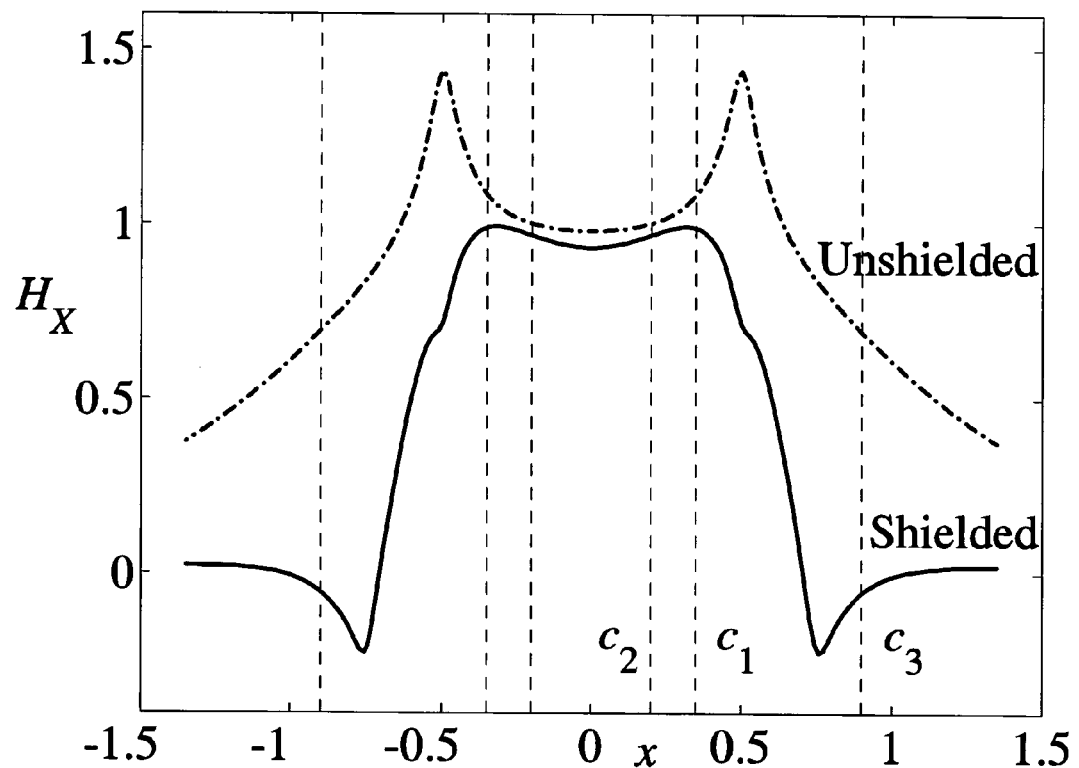
FIG. 5 shows a comparison of the $H_X$ field on a portion of the centre-line (x-axis), obtained with the unshielded bi-planar coil of FIG. 2 (drawn with a dot-dash line) and the shielded bi-planar coil of FIG. 3 (solid line). The vertical dashed lines on the figure indicate the locations of the three pairs of target zones.

A more detailed look at the field produced by this coil is afforded by FIG. 5, which shows the $H_X$ field on a portion of the centre-line (the x-axis). Here, the fields produced by both the unshielded coil of FIG. 2 and the shielded coil of FIGS. 3, 4 are shown, indicated with a dot-dashed line and a solid line, respectively. It is evident that the field from the shielded coil is superior to the unshielded case, on a number of different criteria. Firstly, the shielding has dramatically reduced the magnetic field exterior to the coil, as intended. For example, at $x=\pm 1.2$, the unshielded magnetic field component is approximately $H_X=0.46$ amp/meter and the shielded component is about $H_X=0.019$ amp/meter. Thus the shielding gives a reduction in the exterior field to about 4% of the unshielded field, even quite close to the coil; a similar factor is likewise experienced by the other field components. In addition, the field inside the primary coil is closer to the (constant) target field in the shielded case.

The methods of this invention have also been used to design coils for which the target field is positioned asymmetrically with respect to the bi-planar plates. The winding pattern for an asymmetrically located constant field is displayed in FIG. 6. Here, the parameters are the same as for FIG. 3, except that now $p=-0.7$ and $q=0.1$, so that the target field is very asymmetrically located along the z-axis. The primary coil is shown in FIG. 6A, where it is clear that the target zone has been shifted towards the bottom of the picture. Positive current flows in the large windings in the bottom section of the diagram, but there is negative current in each of the three smaller windings at the top of the picture.

The shield windings for this asymmetric $T_{00}$ coil are presented in FIG. 6B. The direction of the current is reversed in these windings, so as to cancel the magnetic field beyond the shields. Thus there is negative current in the large windings that cover most of the coil, although a small positive current flows in the two small loops in the top two corners of the shield pattern in FIG. 6B.

5.2 Example 2
The $T_{11}$ Bi-planar Coil

As a further illustration of the use of this invention, shielded bi-planar coils will be designed in this section, both for symmetric and asymmetrically located $T_{11}$ fields. The transverse magnetic field component for this case has the general form $H_X(x,y,z)=C_{11}x$ with $C_{11}$ an arbitrary constant. It follows that the target fields on the three pairs of target planes used in this invention must be given by the equations $$H_{TX}(c_1; y, z) = H_{\max}\left(\frac{c_1}{a}\right)$$
$$H_{TX}(c_2; y, z) = H_{\max}\left(\frac{c_2}{a}\right)$$
$$H_{TX}(c_3; y, z) = 0.$$

(5.3)

Here, the constant $H_{max}$ is now the maximum magnetic field strength (in the x-component) on the plane $x=a$ of the primary coil. Its value is set to 1 amp/meter here, for illustrative purposes. As this target field is now anti-symmetric in x, it follows that the coils on the opposing planes of the bi-planar coil (and also the shields) are counter-wound. This is the case discussed explicitly in Section 4.3.

The primary winding for a shielded $T_{11}$ coil in shown in FIG. 7A. In this case, the target zone is located symmetrically, in the central half of the coil ($\alpha_T=0.5$, $p=-0.5$, $q=0.5$). The primary coil is square ($L=B=1$ meter) and the shield is the same size ($r_Y=r_Z=1$). The other parameters are as in FIG. 3. The winding pattern in FIG. 7A possesses a nearly circular central portion surrounded by an eight-fold pattern. There are again small reverse windings in each of the four corners, in which the current is negative.

The corresponding windings for the shield are presented in FIG. 7B. The current in this coil opposes that in the primary; thus the central windings contain negative current and there are small loops in each corner on which the current is positive.

The effectiveness of the coil shown in FIG. 7 is examined in FIG. 8. Here, the magnetic field component $H_X(x,0,0)$ produced by this coil is shown along the x-axis. The locations of the three pairs of target planes are indicated by vertical dashed lines on the figure, and the target field is shown as a dot-dash line. Since the field is linear in x for this particular harmonic, the target field in FIG. 8 is simply a straight line passing through the origin. The magnetic field generated by the coil is drawn in FIG. 8 with a heavier solid line. It shows that the target field is matched very accurately inside the primary coil, and particularly within the inner target region $-c_2<x<c_2$ (here, $c_2=0.2$ meter). This is also confirmed by an examination of the field contours on the centre-plane $y=0$, similarly to FIG. 4, although this is not shown here in the interests of brevity.

Coils have also been designed using the techniques discussed above, for gradient fields located asymmetrically within respect to the bi-planar plates. This only requires the designer to change the values of the target-field parameters p and q in the algorithm presented above. The winding patterns for such an asymmetrically positioned target field are presented in FIG. 9. Here, the off-set parameters have been chosen to be $p=-0.7$ and $q=0.1$, so that this is a very asymmetric coil indeed. The primary windings are presented in FIG. 9A. The main body of the windings is now moved down toward the bottom of the picture, since the target zone is located toward that end of the coil. These windings carry positive current. There is also a smaller isolated pattern of windings toward the top of the figure, and these carry negative current. Finally, another distinct small winding appears in each of the two corners at the top of the diagram, and the current is once again positive there. Thus the shielded asymmetrically located target field requires a primary coil with alternating patterns of current direction in the windings at the end furthest from the target zone.

The windings on the shield coil are shown for this case in FIG. 9B. The asymmetry of the target field is again reflected in the location of the windings presented in this diagram. Consistently with the function of the shield, the current in these coils opposes that in the primary, so that the current has negative sign on the windings in FIG. 9B.

Field contours for the component $H_X(x, 0, z)$ of the magnetic field are presented in FIG. 10, again on the centre-plane $y=0$. Field lines are shown at the 5% level, and the three target regions are indicated by dashed lines. The asymmetry in the location of the interior target fields is very clear from the picture. The coil has been designed with the intention of achieving a linear gradient field within the target zones inside the primary plates, and FIG. 10 shows that this has largely been achieved, except for some irregularity at the top and bottom of these target zones. This is evident from the fact that the field contours within the target region are evenly spaced straight lines, with the zero-field contour running directly down the middle of the diagram.

In terms of the quantitative properties of the bi-planar coil assemblies discussed above in the Summary of the Invention, the coil of this example has an A value of 4.0, an A' value of 0.49, an A'/A value of 0.125, a D value of 0.2, a D' value of 2.8, a D/D' value of 0.07, and a calculated deviation from linearity over the entire DSV (i.e., the volume within the $c_1$ target zones) of approximately 5 percent.

5.3 Example 3

The $T_{21}$ Bi-planar Coil

Another illustration of the use of this invention concerns the design of shielded bi-planar $T_{21}$ coils. The technique has been used to design both symmetric and asymmetrically located fields, although only the latter case will be discussed here.

The transverse component for a symmetrically located $T_{21}$ magnetic field has the general form $H_X(x,y,z)=3C_{21}xz$, where $C_{21}$ is again an arbitrary constant. For a field that is asymmetrically positioned with respect to the origin, it therefore follows that the target fields take the forms $$H_{TX}(c_1; y, z) = H_{\max}\left(\frac{2c_1}{a}\right)\frac{Z_2}{(q-p)} \quad (5.4)$$

$$H_{TX}(c_2; y, z) = H_{\max}\left(\frac{2c_2}{a}\right)\frac{Z_2}{(q-p)}$$

$$H_{TX}(c_3; y, z) = 0.$$

Again, the constant $H_{max}$ is set to the value 1 amp/meter here, for illustrative purposes. This field (5.4) is also antisymmetric in x, as for the case discussed in Section 5.2, and so the coils on the opposing planes of the bi-planar coil and shield are also counter-wound. The quantity $Z_2$ in equations (5.4) is the coordinate defined in equation (5.1).

FIG. 11A shows the winding pattern for the primary coil designed to produce an asymmetric $T_{21}$ field within the interior target region. The primary coils and the shields are both assumed to be square and of the same size (L=B=1 meter), as in previous examples, and the target field is located very asymmetrically towards the bottom of the picture, with off-set parameters p=−0.7 and q=0.1. The streamfunction $\psi^{(a)}$ in equation (4.7a) has been contoured to produce the windings in FIG. 11A, and these may be seen to have a fascinating and complicated form, with alternating patterns of current in neighbouring sections of wire. Thus the current is negative in the loops of wire at the bottom of the figure, positive in the middle sections and negative again in the portion right at the top of the diagram.

The corresponding shield windings for this coil are given in FIG. 11B. Again, the current in this plane opposes that on the primary coils, so that the windings at the bottom of the diagram now contain positive current, while those at the top possess current in the opposite (negative) direction.

B. Exemplary Circular Designs

The methods discussed above have been applied to the design of a variety of circular biplanar coils, in cases when the target field is located symmetrically ($z_c=0$) and asymmetrically ($z_c\neq 0$). It is found that the desired target field can be matched very closely by this technique, when the regularizing parameters in equation (4.23) are taken to be $\lambda^{(a)}=\lambda^{(b)}=10^{-8}$. Two sample designs generated in this way are now presented.

FIG. 12A shows the primary coil, and FIG. 12B shows the shield coil, for a design intended to produce a constant ($T_{00}$) field as in Section 5.1, over the two target spheres defined in equation (4.22). The target field strength was taken to be $H_{max}=1$ A/m for illustrative purposes; other field strengths would produce identical patterns because the equations are linear and so the current densities and field strengths all scale in proportion. These patterns in FIG. 12 have been produced by contouring the streamfunctions $\psi^{(a)}$ and $\psi^{(b)}$ defined in equations (4.20) and (4.21c). This may be accomplished using standard contouring software.

The primary and shield windings in FIG. 12 are located on the planes defined by a=0.4 and b=0.6 respectively, and these two coils have radii R=0.5 and S=0.6 (all distances are in meters). The regions in equations (4.22) have radii $c_1=0.25$ and $c_2=0.1$, and are asymmetrically located with respect to the coils, so that their centres are at $Z_c=0.2$. The outer target regions (on which zero field is prescribed) are located on planes defined by $c_3=1.5$ meters.

When the target field is symmetrically located ($z_c=0$), it is found that the winding patterns on both primary and shield coils consist of concentric circles. This is to be expected. However, for the highly asymmetrical case illustrated in FIG. 12, there is no such circular symmetry. Instead, the winding patterns are highly distorted, and for the primary coil in FIG. 12A, in particular, it is evident that the centre of the winding pattern has now been displaced to the location $z_c=0.2$. There are alternating regions of forward and reverse windings toward the top of the primary coil (the reverse windings are indicated here with dashed lines). The shield winding pattern in FIG. 12B is largely the reverse of the primary pattern in FIG. 12A, since the polarity of the windings largely opposes those on the primary.

The $H_X$ field has been re-constructed from the current densities (for which the winding patterns are illustrated in FIG. 12) using the Biot-Savart law (4.1). This provides a sensitive test of the accuracy of the technique. The $H_X$ field component on a portion of the z-axis is shown in FIG. 13. The target field $H_X=1$ is indicated on the diagram, and the vertical dashed lines give the location of the inner and outer target spherical regions defined in equation (4.22). It is evident that the target field is matched very closely by this technique, particularly over the inner sphere with radius $c_2=0.1$.

Primary and shield windings are shown in FIG. 14, for an asymmetrically positioned x-gradient ($T_{11}$) field $$H_X = H_{max} x/a. \quad (5.5)$$

The target regions have radii $c_1=0.25$ and $c_2=0.1$ and its centre is located at $z_c=0.2$. The effect of the asymmetry is again very evident in the primary windings in FIG. 14A, for which the centre is moved up to $z=0.2$ and the pattern is pushed toward the top of the coil, with a large secondary winding at the bottom of the figure. Coil windings carrying reverse current are again indicated by dashed lines. The effect of the asymmetry is less pronounced for the shield winding in FIG. 14B, although some distortion of the pattern towards the top of the figure is still evident. A large middle region of reverse current is present in the shield design.

The accuracy of the design is again tested by investigating the re-constructed field calculated from the Biot-Savart law (4.1). The $H_X$ field is shown in FIG. 15, along a portion of the line $z=z_c=0.2$ on the plane $y=0$. The magnitude of the field is reasonably large at the coils, on the planes $z=\pm 0.4$ and $z=\pm 0.6$, and only a portion of the full diagram has been shown, in order to focus attention on the target regions which are indicated with vertical dashed lines.

It is again clear that the linear gradient target field has been matched very accurately over the inner spherical target zones. The desired field (5.5) is illustrated on the diagram with a dashed line. The close agreement between the computed field and the linear target field (5.5) is evident, over the inner regions. The outer target zones defined by $c_3=1.5$ are also indicated by dashed vertical lines on the diagram, and it is found that the field decays rapidly, for $|x|>C_3$.

Although specific embodiments of the invention have been described and illustrated, it will be understood by those skilled in the art that various changes to the details presented here may be made, without departing from the spirit and scope of this invention. For example, coils can be designed by the methods of this invention that may produce any desired field type of interest, whether these fields consist purely of spherical harmonics or otherwise. Similarly, the bi-planar coil assemblies of the present invention can be used with bore-type magnetic systems if desired.

A variety of other modifications will be evident to persons of ordinary skill in the art from the disclosure herein. The following claims are intended to cover the specific embodiments set forth herein as well as such modifications, variations, and equivalents.

What is claimed is:

1. A bi-planar coil assembly for producing a magnetic field which comprises one or more specified spherical harmonics in a specified volume, said coil assembly comprising:

(I) a first coil assembly, said assembly comprising one or more windings that (i) define a first plane and (ii) have an outer perimeter in said first plane, said outer perimeter defining a first rectangle having four sides each of which is tangent to the outer perimeter, said first rectangle having (a) the smallest area A of any rectangle which encloses the one or more windings and (b) two diagonals which intersect at a centroid (the centroid of the first rectangle); and (II) a second coil assembly, said assembly comprising one or more windings that (i) define a second plane and (ii) have an outer perimeter in said second plane, said outer perimeter defining a second rectangle having four sides each of which is tangent to the outer perimeter, said second rectangle having (a) the smallest area of any rectangle which encloses the one or more windings and (b) two diagonals which intersect at a centroid (the centroid of the second rectangle);

wherein:

(1) the first and second planes are parallel and spaced from one another;

(2) a line through the centroids of the first and second rectangles defines an x-axis of an x,y,z-coordinate system, the origin of which lies at a point on said x-axis that is equidistant from the first and second planes;

(3) the bi-planar coil assembly produces a magnetic field, the x-component of which, in general form, can be written as:

$$B(r, \theta, \phi) = \sum_{n=0}^{\infty} \sum_{m=0}^{m=n} r^n [A_{nm}\cos(m\phi) + B_{nm}\sin(m\phi)] P_{nm}(\cos\theta)$$

where $A_{nm}$ and $B_{nm}$ are the amplitudes of spherical harmonics, $P_{nm}(\cos \theta)$ are associated Legendre polynomials, n is the order and m the degree of the polynomial, and r, θ, and φ are polar co-ordinates of a polar coordinate system that has an origin that (a) lies in the y-z plane of the x,y,z-coordinate system and (b) is offset from the origin of the x,y,z-coordinate system;

(4) the specified volume lies between the first and second planes and has a center that lies at the origin of the polar coordinate system; and (5) at least one of the one or more specified spherical harmonics has a degree m' and an order n' which satisfy the relationships:

(i) m'≧0, and (ii) n'=0 or n'≧2.

2. The bi-planar coil assembly of claim 1 wherein the specified volume when projected onto the first plane has a projected area A' that is greater than or equal to 0.05·A.

3. The bi-planar coil assembly of claim 2 where A' is greater than or equal to 0.1·A.

4. A bi-planar coil assembly for producing a magnetic field which comprises one or more specified spherical harmonics in a specified volume, said coil assembly comprising:

(I) a first coil assembly, said assembly comprising one or more windings that (i) define a first plane and (ii) have an outer perimeter in said first plane, said outer perimeter defining a first rectangle having four sides each of which is tangent to the outer perimeter, said first rectangle having (a) the smallest area A of any rectangle which encloses the one or more windings and (b) two diagonals which intersect at a centroid (the centroid of the first rectangle); and (II) a second coil assembly, said assembly comprising one or more windings that (i) define a second plane and (ii) have an outer perimeter in said second plane, said outer perimeter defining a second rectangle having four sides each of which is tangent to the outer perimeter, said second rectangle having (a) the smallest area of any rectangle which encloses the one or more windings and (b) two diagonals which intersect at a centroid (the centroid of the second rectangle);

wherein:

(1) the first and second planes are parallel and spaced from one another;

(2) a line through the centroids of the first and second rectangles defines an x-axis of an x,y,z-coordinate system, the origin of which lies at a point on said x-axis that is equidistant from the first and second planes;

(3) the bi-planar coil assembly produces a magnetic field, the x-component of which, in general form, can be written as:

$$B(r, \theta, \phi) = \sum_{n=0}^{\infty} \sum_{m=0}^{m=n} r^n [A_{nm}\cos(m\phi) + B_{nm}\sin(m\phi)] P_{nm}(\cos\theta)$$

where $A_{nm}$ and $B_{nm}$ are the amplitudes of spherical harmonics, $P_{nm}(\cos\theta)$ are associated Legendre polynomials, n is the order and m the degree of the polynomial, and r,θ, and φ are polar co-ordinates of a polar coordinate system that has an origin that (a) lies in the y-z plane of the x,y,z-coordinate system and (b) is offset from the origin of the x,y,z-coordinate system;

(4) the specified volume lies between the first and second planes and has a center that lies at the origin of the polar coordinate system;

(5) at least one of the one or more specified spherical harmonics has a degree m' and an order n' which satisfy the relationships n'=1 and m'=0 or m'=1 (the one or more specified gradient harmonics);

(6) the specified volume comprises a portion (the substantially linear portion of the specified volume) throughout which each of the one or more specified gradient harmonics has a calculated deviation from linearity that is less than or equal to 10 percent; and (7) the substantially linear portion of the specified volume when projected onto the first plane has a projected area $A_L$ that is greater than or equal to 0.05·A.

5. The bi-planar coil assembly of claim 4 where $A_L$ is greater than or equal to 0.1·A.

6. The bi-planar coil assembly of claim 4 where the calculated deviation from linearity throughout the substantially linear portion is less than or equal to 5 percent.

7. The bi-planar coil assembly of claim 4 wherein the substantially linear portion of the specified volume is the entire specified volume.

8. The bi-planar coil assembly of claim 1 or 4 wherein:
(i) the origin of the polar coordinate system lies at a distance D from the origin of the x,y,z-coordinate system;
(ii) the diagonals of the first rectangle each have a length D'; and
(iii) D/D'>0.05.

9. The bi-planar coil assembly of claim 8 wherein:

D/D'≧0.1.

10. The bi-planar coil assembly of claim 8 wherein:

D/D'>0.2.

11. The bi-planar coil assembly of claim 1 or 4 wherein:
(i) the origin of the polar coordinate system lies at a distance D from the origin of the x,y,z-coordinate system; and
(ii) D is greater than or equal to 10 centimeters.

12. The bi-planar coil assembly of claim 11 where D is greater than or equal to 20 centimeters.

13. The bi-planar coil assembly of claim 1 or 4 wherein:
(i) the one or more specified spherical harmonics is a single harmonic; and
(ii) the bi-planar coil assembly has a calculated purity P' that is less than or equal to 0.2, where P' equals the ratio of (1) the sum of the magnitudes of all harmonic coefficients other than the coefficient of the single harmonic which have a magnitude which is at least 0.001% of the magnitude of the coefficient of the single harmonic to (2) the magnitude of the coefficient of the single harmonic, where the coefficients of the spherical harmonics are calculated based on calculated or measured field strengths at points within and/or on the outer periphery of the specified volume.

14. The bi-planar coil assembly of claim 13 where P' is less than or equal to 0.05.

15. The bi-planar coil assembly of claim 13 wherein the specified volume when projected onto the first plane has a projected area A' that is greater than or equal to 0.05·A.

16. The bi-planar coil assembly of claim 1 or 4 wherein:
(i) the one or more specified spherical harmonics comprises at least two harmonics; and
(ii) the bi-planar coil assembly has a calculated purity P' that is less than or equal to 0.2, where P' equals the ratio of (1) the sum of the magnitudes of all harmonic coefficients other than the coefficients of the at least two harmonics which have a magnitude which is at least 0.001% of the magnitude of the largest coefficient of the at least two harmonics to (2) the sum of the magnitudes of the coefficients of the at least two harmonics, where the coefficients of the spherical harmonics are calculated based on calculated or measured field strengths at points within and/or on the outer periphery of the specified volume.

17. The bi-planar coil assembly of claim 16 where P' is less than or equal to 0.05.

18. The bi-planar coil assembly of claim 16 wherein the specified volume when projected onto the first plane has a projected area A' that is greater than or equal to 0.05·A.

19. The bi-planar coil assembly of claim 1 or 4 further comprising:
(i) a third coil assembly, said assembly comprising one or more windings that define a third plane; and
(ii) a fourth coil assembly, said assembly comprising one or more windings that define a fourth plane;
wherein:
(1) the third plane is parallel to and spaced outward from the first plane along the x-axis;
(2) the fourth plane is parallel to and spaced outward from the second plane along the x-axis; and
(3) the third and fourth coils are shielding coils that serve to reduce the magnitude of the magnetic field produced by the bi-planar coil assembly outside of the third and fourth coil assemblies.

20. The bi-planar coil assembly of claim 1 or 4 wherein the outer perimeter of the one or more windings of the first coil assembly is substantially rectangular.

21. The bi-planar coil assembly of claim 1 or 4 wherein the outer perimeter of the one or more windings of the first coil assembly is substantially square.

22. The bi-planar coil assembly of claim 1 or 4 wherein the outer perimeter of the one or more windings of the first coil assembly is substantially circular.

23. The bi-planar coil assembly of claim 1 or 4 wherein the coil assembly is a shim coil assembly for a magnetic resonance system.

24. A shim set comprising a plurality of coil assemblies at least one of which is a bi-planar coil assembly defined by claim 1 or 4.

25. A magnetic resonance system comprising the shim set of claim 24.

26. A shim set comprising a plurality of coil assemblies each of which is a bi-planar coil assembly defined by claim 1 or 4.

27. A magnetic resonance system comprising the shim set of claim 26.

28. A magnetic resonance system comprising:
    (a) a bi-planar coil assembly for producing a main magnetic field, said assembly having a main magnet DSV and a main magnet geometric center;
    (b) three bi-planar coil assemblies for producing x, y, and z gradient fields, each assembly having a gradient DSV; and
    (c) a set of bi-planar coil assemblies for producing shim fields, each member of the set having a shim DSV;
    wherein the main magnet, gradient, and shim DSV's have a common center which is offset from the main magnet geometric center.

29. The magnetic resonance system of claim 28 wherein the offset is greater than or equal to 10 centimeters.

30. The magnetic resonance system of claim 28 wherein the offset is greater than or equal to 20 centimeters.

31. A method of forming a magnetic resonance image of a portion of a subject's body comprising:
    (A) providing a magnetic resonance system which comprises:
        (i) a bi-planar coil assembly for producing a main magnetic field, said assembly having a main magnet DSV and a main magnet geometric center,
        (ii) three bi-planar coil assemblies for producing x, y, and z gradient fields, each assembly having a gradient DSV, and
        (iii) a set of bi-planar coil assemblies for producing shim fields, each member of the set having a shim DSV,
        said main magnet, gradient, and shim DSV's have a common center which is offset from the main magnet geometric center;
    (B) placing the portion of the subject's body in the main magnet DSV; and
    (C) using the magnetic resonance system to form a magnetic resonance image of the portion of the subject's body.

32. The method of claim 31 wherein the offset is greater than or equal to 10 centimeters.

33. The method of claim 31 wherein the offset is greater than or equal to 20 centimeters.

34. The method of claim 31 wherein the portion of the subject's body is the subject's wrist, elbow, ankle, or knee.

35. A method of forming a magnetic resonance image of a portion of a subject's body comprising:
    (A) providing a magnetic resonance system which comprises a bi-planar coil assembly for producing a main magnetic field, said assembly having a main magnet geometric center and a main magnet DSV, said main magnet DSV having a center that is offset from the main magnet geometric center;
    (B) placing the portion of the subject's body in the main magnet DSV; and
    (C) using the magnetic resonance system to form a magnetic resonance image of the portion of the subject's body.

36. The method of claim 35 wherein the offset is greater than or equal to 10 centimeters.

37. The method of claim 35 wherein the offset is greater than or equal to 20 centimeters.

38. The method of claim 35 wherein the portion of the subject's body is the subject's wrist, elbow, ankle, or knee.

* * * * *